(12) United States Patent
Kato et al.

(10) Patent No.: US 10,269,866 B2
(45) Date of Patent: Apr. 23, 2019

(54) MAGNETORESISTIVE ELEMENT AND MAGNETIC MEMORY

(71) Applicants: Kabushiki Kaisha Toshiba, Minato-ku (JP); Tohoku University, Sendai-shi (JP)

(72) Inventors: Yushi Kato, Chofu (JP); Tadaomi Daibou, Yokohama (JP); Eiji Kitagawa, Yokohama (JP); Takao Ochiai, Funabashi (JP); Junichi Ito, Yokohama (JP); Takahide Kubota, Sendai (JP); Shigemi Mizukami, Sendai (JP); Terunobu Miyazaki, Sendai (JP)

(73) Assignees: KABUSHIKI KAISHA TOSHIBA, Minato-ku (JP); TOHOKU UNIVERSITY, Sendai-shi (JP)

( * ) Notice: Subject to any disclaimer, the term of this patent is extended or adjusted under 35 U.S.C. 154(b) by 0 days.

(21) Appl. No.: 15/010,669

(22) Filed: Jan. 29, 2016

(65) Prior Publication Data

US 2016/0148975 A1 May 26, 2016

Related U.S. Application Data

(63) Continuation of application No. PCT/JP2014/068818, filed on Jul. 15, 2014.

(30) Foreign Application Priority Data

Aug. 2, 2013 (JP) .................. 2013-161823

(51) Int. Cl.
*H01L 27/22* (2006.01)
*H01L 43/02* (2006.01)
(Continued)

(52) U.S. Cl.
CPC ............ *H01L 27/228* (2013.01); *H01L 43/02* (2013.01); *H01L 43/08* (2013.01); *H01L 43/10* (2013.01)

(58) Field of Classification Search
CPC ......... H01L 43/02; H01L 43/08; H01L 43/10; H01L 27/228
See application file for complete search history.

(56) References Cited

U.S. PATENT DOCUMENTS 7,567,413 B2 * 7/2009 Ide .................. B82Y 25/00
360/324.11
8,686,521 B2 * 4/2014 Daibou .................. G11C 11/16
257/421

(Continued)

FOREIGN PATENT DOCUMENTS

JP 2008-47739 A 2/2008
JP 2010-80536 A 4/2010
(Continued)

OTHER PUBLICATIONS

Cui et. al., "Ferromagnetic Tetragonal L10-Type MnGa Isotropic Nanocrystalline Microparticles," IEEE Transactions on Magnetics, vol. 49, No. 7, Jul. 2013.*

(Continued)

*Primary Examiner* — Jarrett J Stark
*Assistant Examiner* — Charles N Ausar-El
(74) *Attorney, Agent, or Firm* — Oblon, McClelland, Maier & Neustadt, L.L.P.

(57) ABSTRACT

A magnetoresistive element includes: a first ferromagnetic layer; a second ferromagnetic layer; and a first nonmagnetic layer disposed between the first ferromagnetic layer and the second ferromagnetic layer, the first ferromagnetic layer including $(Mn_xGa_y)_{100-z}Pt_z$, the $(Mn_xGa_y)_{100-z}Pt_z$ having a tetragonal crystal structure, where 45 atm %≤x≤75 atm %, 25 atm %≤y≤55 atm %, x+y=100 atm %, and 0 atm %<z≤7 atm %.

4 Claims, 24 Drawing Sheets

(51) Int. Cl.
*H01L 43/08* (2006.01)
*H01L 43/10* (2006.01)

(56) References Cited

U.S. PATENT DOCUMENTS

| | | | |
|---|---|---|---|
| 8,895,162 B2 | 11/2014 | Nishiyama et al. | |
| 2008/0113222 A1* | 5/2008 | Tondokoro | B82Y 10/00 428/812 |
| 2009/0243008 A1* | 10/2009 | Kitagawa | G11C 11/16 257/421 |
| 2010/0072528 A1* | 3/2010 | Inokuchi | H01L 29/66984 257/295 |
| 2010/0188771 A1* | 7/2010 | Okamura | B82Y 10/00 360/75 |
| 2011/0073970 A1* | 3/2011 | Kai | G11C 11/16 257/421 |
| 2011/0089508 A1* | 4/2011 | Min | B82Y 10/00 257/421 |
| 2012/0018825 A1* | 1/2012 | Lim | H01L 43/08 257/421 |
| 2012/0068139 A1* | 3/2012 | Daibou | H01L 43/10 257/2 |
| 2012/0069642 A1* | 3/2012 | Ueda | G11C 11/16 365/158 |
| 2012/0141837 A1* | 6/2012 | Kurt | G11B 5/65 428/832 |
| 2012/0163070 A1* | 6/2012 | Nagase | B82Y 25/00 365/158 |
| 2012/0241881 A1* | 9/2012 | Daibou | H01L 43/10 257/421 |
| 2013/0009260 A1 | 1/2013 | Apalkov et al. | |
| 2013/0077388 A1* | 3/2013 | Inokuchi | G11C 11/16 365/158 |
| 2013/0249026 A1* | 9/2013 | Kitagawa | H01L 43/08 257/421 |
| 2013/0249028 A1* | 9/2013 | Kamata | H01L 43/08 257/427 |
| 2014/0077319 A1* | 3/2014 | Noma | H01L 43/02 257/421 |
| 2014/0084398 A1* | 3/2014 | Oguz | H01L 43/12 257/421 |
| 2014/0299232 A1* | 10/2014 | Ezer | B32B 15/01 148/108 |
| 2015/0086765 A1* | 3/2015 | Garg | C30B 29/32 428/216 |
| 2015/0188034 A1* | 7/2015 | Takahashi | H01L 43/02 257/421 |

FOREIGN PATENT DOCUMENTS

| | | |
|---|---|---|
| JP | 2010-140586 A | 6/2010 |
| JP | 2010-212631 A | 9/2010 |
| JP | 2010-232499 A | 10/2010 |
| JP | 2012-204683 A | 10/2012 |
| JP | 2013-21328 A | 1/2013 |
| JP | 2013-73978 A | 4/2013 |

OTHER PUBLICATIONS

Krishnan, "Ferromagnetic δ-Mn1—xGax thin films with perpendicular anisotropy", Appl. Phys. Lett. 61 (19), Nov. 9, 1992, p. 2365-2367.*

Cui et. al., "Ferromagnetic Tetragonal L10-Type MnGa Isotropic Nanocrystalline Microparticles," IEEE Transactions on Magnetics, vol. 49, No. 7, Jul. 2013, 3322-3325.*

Hong et. al., "Rare-earth Free Permanent Magnets for High Temperature Applications: Hexagonal Mn—Bi—(X) and Ba-Ferrite (BaFe12—xAlxO19) for core-shell Magnet Design," ARPA-E Critical Materials Technology Workshop, Department of Energy, Arlington, Virginia, Dec. 6, 2010.*

International Search Report dated Aug. 12, 2014 in PCT/JP2014/068818 (with English language translation).

International Preliminary Report on Patentability and Written Opinion dated Feb. 11, 2016 in PCT/JP2014/068818 filed Jul. 15, 2014 (submitting English translation only).

Vajiheh Alijani, et al., "Tuning the magnetism of the Heusler alloys Mn3—xCoxGa from soft and half-metallic to hard-magnetic for spin-transfer torque applications" Applied Physics Letters, vol. 99, 2011, pp. 222510-1-222510-3.

* cited by examiner

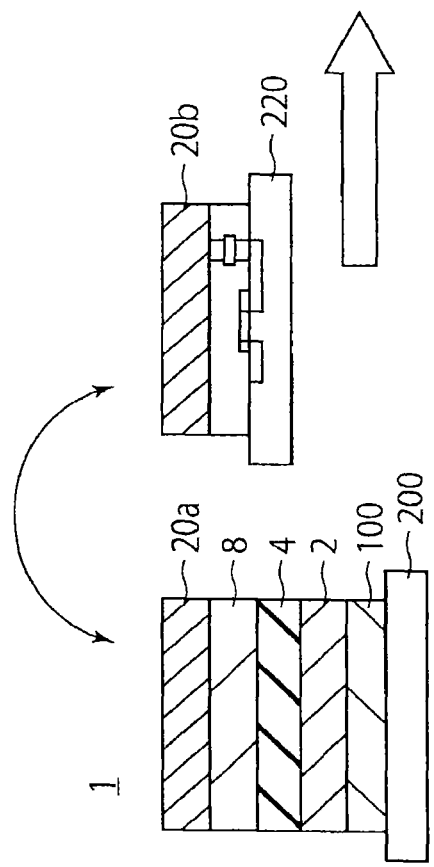

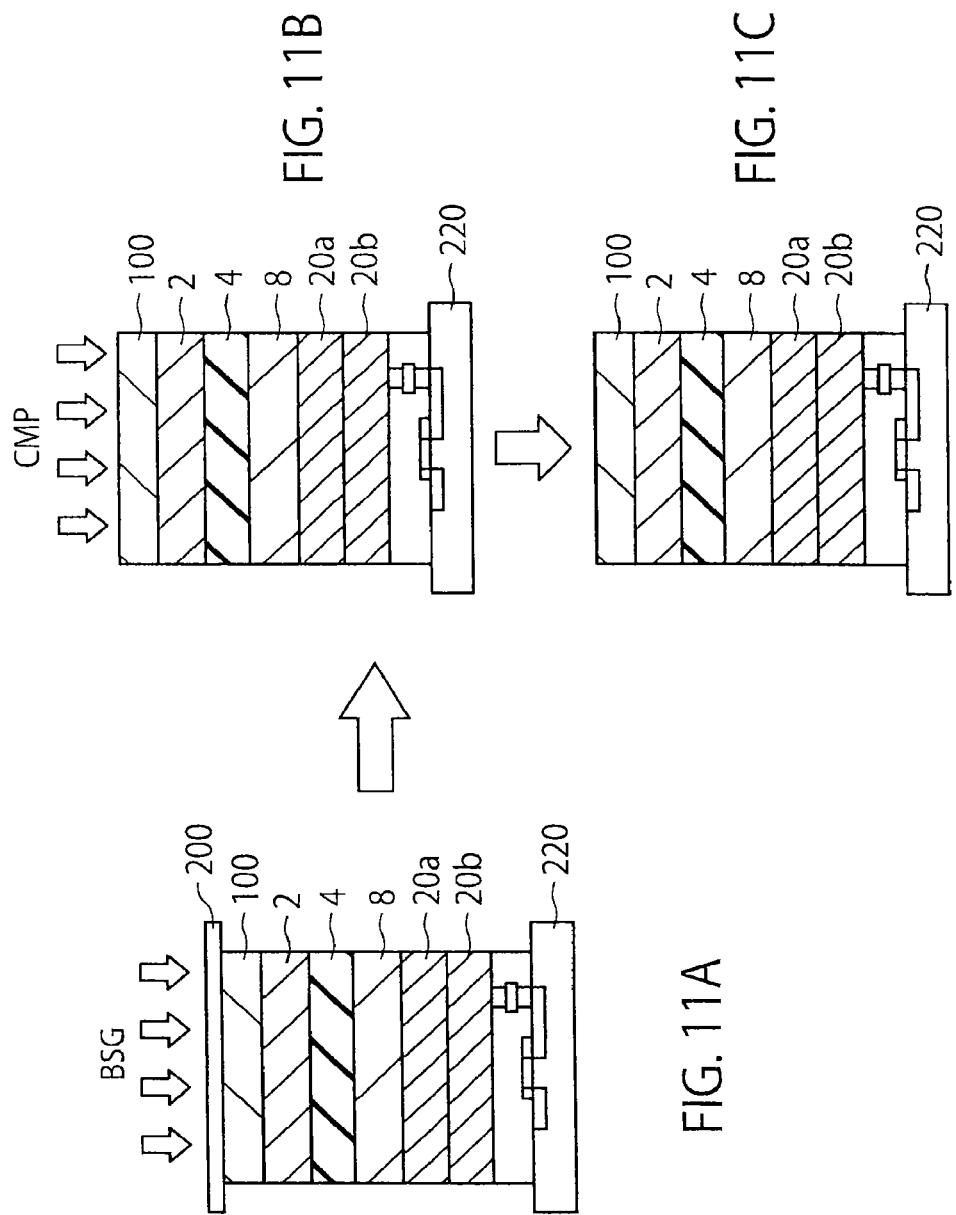

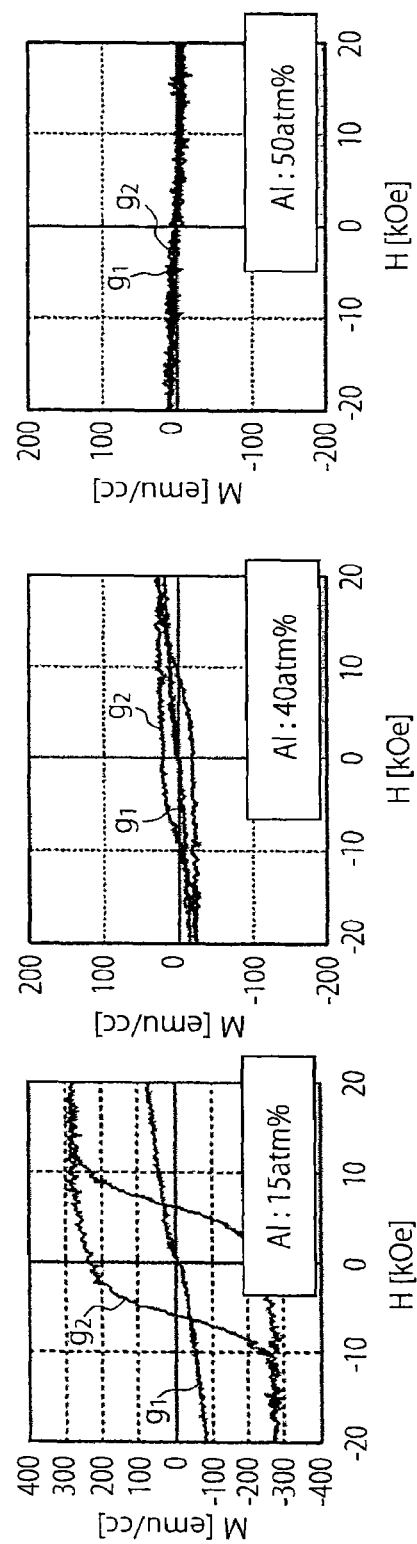

Al CONTENT $X_{Al}$ (atm%)

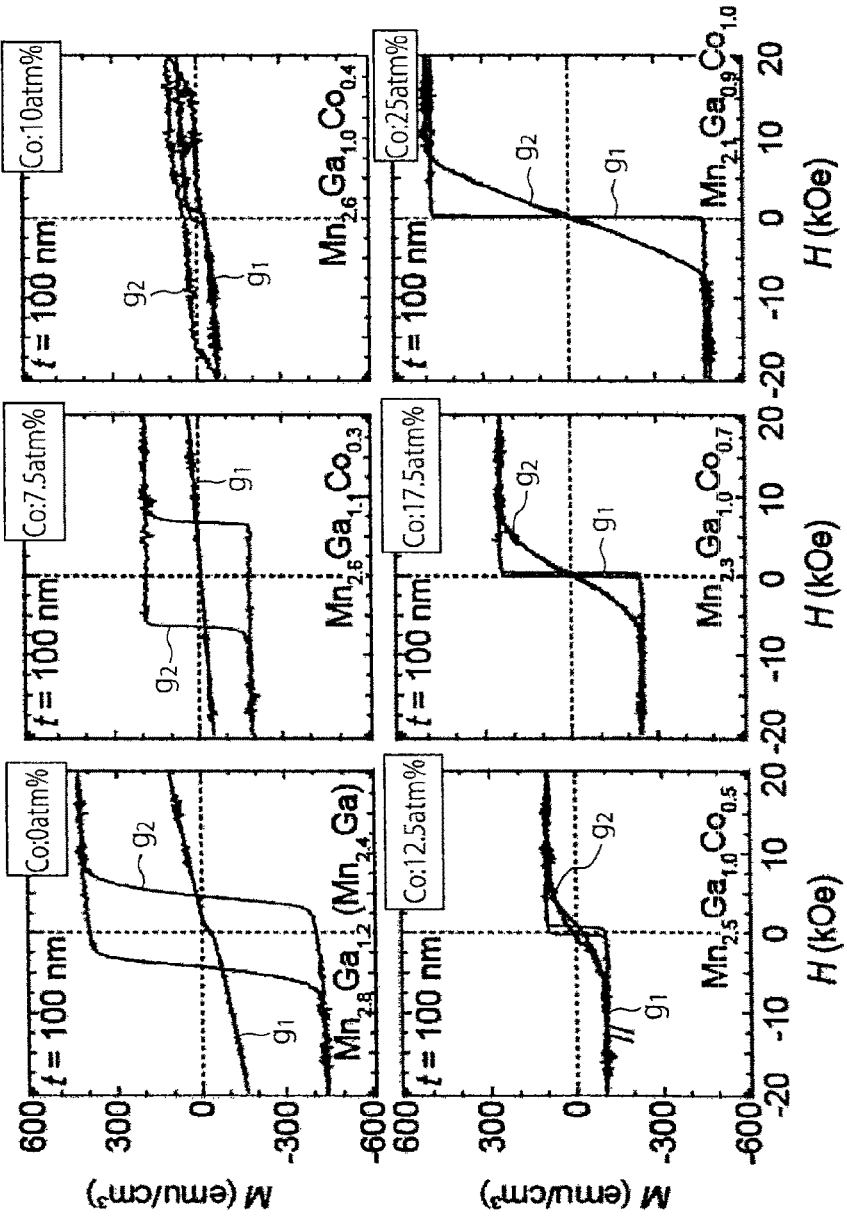

MAGNETORESISTIVE ELEMENT AND MAGNETIC MEMORY

CROSS REFERENCE TO RELATED APPLICATIONS

This application is a continuation of International Application No. PCT/JP2014/068818, filed on Jul. 15, 2014, which is based upon and claims the benefit of priority from the prior Japanese Patent Application No. 2013-161823, filed on Aug. 2, 2013, the entire contents of which are incorporated herein by reference.

FIELD

Embodiments described herein relate generally to magnetoresistive elements and magnetic memories.

BACKGROUND

Magnetic tunnel junction (MTJ) elements serve as magnetoresistive elements. A magnetic tunnel junction element basically has a multilayer structure including a storage layer in which the magnetization direction is changeable, a reference layer in which the magnetization direction is unchangeable, and an insulating layer disposed between the storage layer and the reference layer. The MTJ element is known to have a tunneling magnetoresistive (TMR) effect, and used as a storage element of a memory cell in magnetic random access memories (MRAMs).

An MRAM is a nonvolatile memory in which each MTJ element stores information ("1" or "0") determined based on the change in relative angle of the magnetizations in its magnetic layers. The magnetization is switched (changed) in a few nanoseconds. This enables high-speed writing and reading of data. Therefore, the MRAMs are expected to be next-generation, high-speed nonvolatile memories. The cell size of the MRAMs may be reduced by employing so-called "spin transfer torque magnetization switching," which controls magnetization by means of spin polarized current. Reducing the cell size leads to an increase in current density. Thus, the MRAMs with advantages of easy magnetization switching of storage layers, high density, and low power consumption may be obtained.

In improving the density of nonvolatile memories, the magnetoresistive elements should be highly integrated. However, the thermal stability of the ferromagnetic materials of the magnetoresistive elements tends to be reduced as the element size is decreased. Therefore, improvement in the magnetic anisotropy and the thermal stability of the ferromagnetic materials is a problem of the MRAMS.

In order to solve the problem, it has recently been attempted to form MRAMs with perpendicular magnetization MTJ elements, in which the magnetization of a ferromagnetic material is oriented in a direction perpendicular to the film plane. The ferromagnetic materials of the perpendicular magnetization MTJ elements generally have a large crystalline magnetic anisotropy.

BRIEF DESCRIPTION OF THE DRAWINGS

FIGS. 10A and 10B are explanatory diagrams illustrating a method of manufacturing an MTJ element with a magnetic film having a single crystal structure.

FIGS. 11A to 11C are explanatory diagrams illustrating the method of manufacturing the MTJ element with a magnetic film having the single crystal structure.

FIGS. 17A to 17C show the magnetization curves when the Al content in the MnGaAl alloy is 15 atm %, 40 atm %, and 50 atm %, respectively.

FIGS. 25A to 25F show examples of the magnetization curves of a MnGaCo alloy.

DETAILED DESCRIPTION

Figure 1:
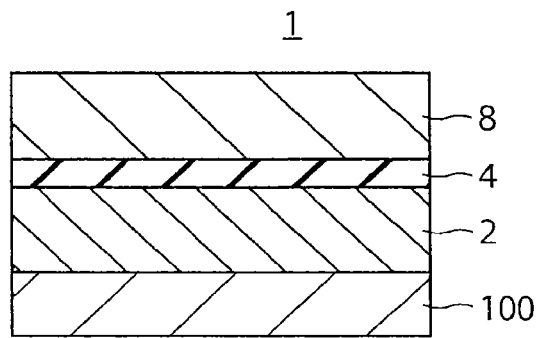
FIG. 1 is a cross-sectional view of a magnetoresistive element according to a first embodiment.

A magnetoresistive element according to an embodiment includes: a first magnetic layer; a second magnetic layer; a first nonmagnetic layer disposed between the first magnetic layer and the second magnetic layer; and a third magnetic layer disposed between the first magnetic layer and the first nonmagnetic layer, the first magnetic layer including $(Mn_x Ga_y)_{100-z}Co_z$ (45 atm % ≤ x ≤ 75 atm %, 25 atm % ≤ y ≤ 55 atm %, x+y=100 atm %, 0 atm % < z ≤ 10 atm %).

Embodiments will now be described with reference to the accompanying drawings. In the following descriptions, elements with the same function and the same structure have the same reference numerals, and the descriptions on the function and the structure of these elements are repeated only when they are needed.

Before the embodiment are described, how the inventors reached the embodiments will be described. In spin transfer torque MRAMs, the switching current for switching the magnetization by means of the spin transfer torque is dependent on the Gilbert damping constant of the storage layer. Therefore, in order to switch the magnetization of the storage layer by means of the spin transfer torque in a low current, the Gilbert damping constant of the storage layer should be set low. Furthermore, the effect of the stray magnetic field from the reference layer becomes more apparent as the size of the elements is more reduced. Therefore, in order to achieve a high integration of the magnetoresistive elements, it may be necessary to reduce the saturation magnetization while maintaining the high magnetic anisotropy of the reference layer. The inventors have studied hard to obtain a magnetoresistive element having a low saturation magnetization and a high perpendicular magnetic anisotropy, and a magnetic memory using this magnetoresistive element. Examples of such a magnetoresistive element and such a magnetic memory will be described as embodiments below.

First Embodiment

FIG. 1 shows a cross-sectional view of a magnetoresistive element 1 according to a first embodiment. The magnetoresistive element 1 according to the first embodiment is an MTJ element having a structure in which a ferromagnetic layer 2, a nonmagnetic layer 4 ("tunnel barrier layer 4") and a ferromagnetic layer 8 are disposed in this order on a base layer 100. The base layer 100 is used to control the crystallinity including the crystal orientation and the crystal grain size of the ferromagnetic layer 2 and the layers above the ferromagnetic layer 2. The specific examples of the crystallinity will be described later. At least one of the ferromagnetic layer 2 and the ferromagnetic layer 8 is a magnetic layer containing Mn, Ga, and at least one element from the group of Al, Ge, Ir, Cr, Co, Pt, Ru, Pd, Rh, Ni, Fe, Re, Au, Cu, B, C, P, Gd, Tb, and Dy. This magnetic layer is described as MnGaX. The element X indicates the at least one element from the group of Al, Ge, Ir, Cr, Co, Pt, Ru, Pd, Rh, Ni, Fe, Re, Au, Cu, B, C, P, Gd, Tb, and Dy.

The resistance value of an MTJ element is determined by the angle between the magnetization directions of two magnetic layers disposed with a tunnel barrier therebetween. The angle between the magnetization directions may be controlled by an external magnetic field or a current flowing through the MTJ element. The angle may be controlled more stably by setting a larger difference in the coercive force, the anisotropy magnetic field Hk, or the Gilbert damping constant α between the two magnetic layers. One of the magnetic layers having a lager coercive force, anisotropy magnetic field Hk, or Gilbert damping constant α is called a reference layer, and the other having a smaller coercive force, anisotropy magnetic field Hk, or Gilbert damping constant α is called a storage layer. Generally, the magnetic layer serving as the reference layer is expected to have a larger coercive force, anisotropy magnetic field Hk, or Gilbert damping constant α, and the magnetic layer serving as the storage layer is expected to have a smaller coercive force, anisotropy magnetic field Hk, or Gilbert damping constant α. The MnGaX magnetic layer is suitable to be used as a reference layer or storage layer since its polarizability, coercive force, anisotropy magnetic field, and Gilbert damping constant can be adjusted by controlling the contents of the elements, as will be described later.

The c-axis of MnGaX in the ferromagnetic layer of the first embodiment serves as the easy magnetization axis. Therefore, a perpendicular magnetization MTJ element may be produced by causing the c-axis of the crystal to be in a direction perpendicular to the film plane. The film plane herein means a plane extending in a direction perpendicular to the direction in which the layers are stacked.

The nonmagnetic layer 4 is preferably formed of an oxide insulator in the first embodiment. If the MTJ element has a multilayer structure including a ferromagnetic layer of CoFe (B), a nonmagnetic layer of crystalline MgO, and a ferromagnetic layer of MnGaX stacked in this order, the orientation MnGaX(001)/MgO(001)/CoFe(B)(001) may be obtained. The expression CoFe(B) means that the ferromagnetic layer may contain B other than Co and Fe. The expression such as MnGaX(001) and MgO(001) means that the crystal is oriented to expose the (001) surface on the top. This improves the wave number selection range of the tunneling electrons to have a larger magnetoresistive ratio.

The direction of easy magnetization of the ferromagnetic layer 2 and the ferromagnetic layer 8 may be caused to be perpendicular to the film plane by controlling the crystal orientation thereof. Therefore, the magnetoresistive element 1 according to the first embodiment may be not only an in-plane magnetization MTJ element in which the magnetization direction is parallel to the film plane, but also a perpendicular magnetization MTJ element in which the magnetization direction of the ferromagnetic layer 2 and the ferromagnetic layer 8 is perpendicular to the film plane. The direction of easy magnetization is a direction along which the internal energy of the spontaneous magnetization in a macro-size ferromagnetic material is the lowest if no external magnetic field exists. The direction of hard magnetization, on the other hand, is a direction along which the internal energy of the spontaneous magnetization in the macro-size ferromagnetic material is the highest if no external magnetic field exists.

When a write current is caused to flow in the MTJ element 1, the direction of magnetization in one of the ferromagnetic layer 2 and the ferromagnetic layer 8 is not changed, but the other may be changed. The ferromagnetic layer in which the direction of magnetization is uncharged is called a reference layer, and the ferromagnetic layer in which the direction of magnetization may be changed is called a storage layer. In the first embodiment, the ferromagnetic layer 2 is the storage layer and the ferromagnetic layer 8 is the reference layer, for example.

The write current is caused to flow between the ferromagnetic layer 2 and the ferromagnetic layer 8 in a direction perpendicular to the film plane. If the ferromagnetic layer 2 is the storage layer and the ferromagnetic layer 8 is the reference layer, and if the direction of magnetization of the ferromagnetic layer 2 and the direction of magnetization of the ferromagnetic layer 8 are antiparallel (opposite) to each other, the write current is caused to flow from the ferromagnetic layer 2 to the ferromagnetic layer 8. In this case, electrons flow from the ferromagnetic layer 8 to the ferromagnetic layer 2 via the nonmagnetic layer 4. The electrons passing through the ferromagnetic layer 8 are spin-polarized and then flow into the ferromagnetic layer 2. The electrons spin-polarized in the same direction as the magnetization of the ferromagnetic layer 2 pass through the ferromagnetic layer 2, but the electrons spin-polarized in the opposite direction to the magnetization of the ferromagnetic layer 2 exerts the spin torque on the magnetization of the ferromagnetic layer 2 to orient the magnetization of the ferromagnetic layer 2 to be in the same direction as the magnetization of the ferromagnetic layer 8. This switches the direction of magnetization of the ferromagnetic layer 2 to be in parallel to (the same as) the direction of magnetization of the ferromagnetic layer 8.

If the direction of magnetization in the ferromagnetic layer 2 and the direction of magnetization in the ferromagnetic layer 8 are parallel to each other, the write current is caused to flow from the ferromagnetic layer 8 to the ferromagnetic layer 2. In this case, electrons flow from the ferromagnetic layer 2 to the ferromagnetic layer 8 via the nonmagnetic layer 4. The electrons passing through the ferromagnetic layer 2 are spin-polarized and then flow into the ferromagnetic layer 8. The electrons spin-polarized in the same direction as the magnetization of the ferromagnetic layer 8 pass through the ferromagnetic layer 8, but the electrons spin-polarized in the opposite direction to the magnetization of the ferromagnetic layer 8 are reflected at the interface between the nonmagnetic layer 4 and the ferromagnetic layer 8, and flows into the ferromagnetic layer 2 via the nonmagnetic layer 4. This exerts a spin torque on the magnetization of the ferromagnetic layer 2 to orient the direction of magnetization of the ferromagnetic layer 2 to be in the direction opposite to the direction of magnetization of the ferromagnetic layer 8. This switches the direction of magnetization in the ferromagnetic layer 2 to be antiparallel to the direction of magnetization of the ferromagnetic layer 8.

(Modification)

Figure 2:
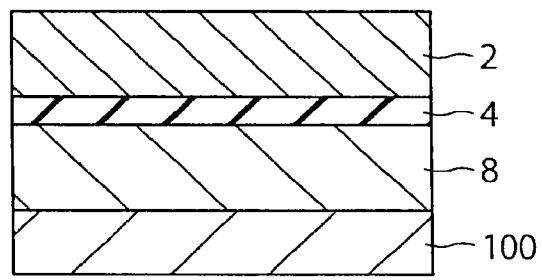
FIG. 2 is a cross-sectional view of a magnetoresistive element according to a modification of the first embodiment.

In the first embodiment, the ferromagnetic layer 2, the nonmagnetic layer 4, and the ferromagnetic layer 8 are stacked on the base layer 100 in this order. However, the stacking order may be reversed as in a magnetoresistive element according to a modification of the first embodiment shown in FIG. 2. Specifically, the ferromagnetic layer 8, the nonmagnetic layer 4, and the ferromagnetic layer 2 may be stacked on the base layer 100 in this order.

Second Embodiment

Figure 3:
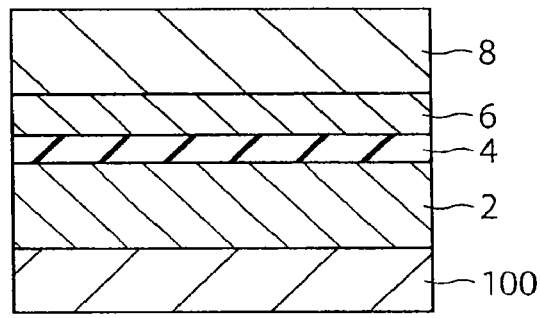
FIG. 3 is a cross-sectional view of a magnetoresistive element according to a second embodiment.

FIG. 3 shows a magnetoresistive element 1A according to a second embodiment. The magnetoresistive element 1A is obtained by disposing an interfacial magnetic layer 6 between the nonmagnetic layer 4 and the ferromagnetic layer 8 of the magnetoresistive element 1 according to the first embodiment shown in FIG. 1. At least one of the ferromagnetic layer 2, the ferromagnetic layer 8 and the interfacial magnetic layer 6 is a magnetic layer including Mn, Ga, and at least one element from the group of Al, Ge, Ir, Cr, Co, Pt, Ru, Pd, Rh, Ni, Fe, Re, Au, Cu, B, C, P, Gd, Tb, and Dy.

As in the first embodiment, the ferromagnetic layer 2 and the ferromagnetic layer 8 may be caused to have a magnetic anisotropy perpendicular to the film plane to have an easy magnetization axis perpendicular to the film plane by controlling the crystal orientation. Therefore, the magnetoresistive element 1A according to the second embodiment may be not only an in-plane magnetization MTJ element but also a perpendicular magnetization MTJ element in which the magnetization direction of the ferromagnetic layer 2 and the magnetization direction of the ferromagnetic layer 8 are perpendicular to the film plane. When a write current is caused to flow in the MTJ element 1A, the direction of magnetization in one of the ferromagnetic layer 2 and the ferromagnetic layer 8 is not changed, but the other may be changed. In the second embodiment, the ferromagnetic layer 2 is the storage layer, and the ferromagnetic layer 8 is the reference layer, for example. As in the first embodiment, the write current is caused to flow between the ferromagnetic layer 2 and the ferromagnetic layer 8 in a direction perpendicular to the film plane. The interfacial magnetic layer 6 is disposed to increase the spin polarization.

If the nonmagnetic layer 4 is formed of crystalline MgO and the interfacial magnetic layer 6 on the nonmagnetic layer 4 is formed of MnGaX in the second embodiment, for example, the ferromagnetic layer 8 including Mn and at least one element from Al, Ge, and Ga may be epitaxially grown on the interfacial magnetic layer 6. For example, if the ferromagnetic layer 8 is formed of an alloy containing Mn and Ga, an epitaxial structure of MnGa(001)/MnGaX(001)/MgO(001) may be formed. This improves the wave number selection range of the tunneling electrons to have a large magnetoresistive ratio. Furthermore, a reference layer with a low saturation magnetization may be obtained.

(Modification)

Figure 4:
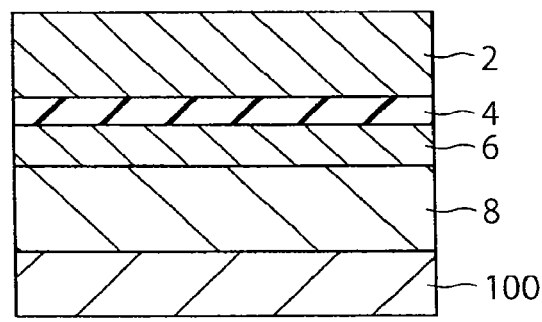
FIG. 4 is a cross-sectional view of a magnetoresistive element according to a modification of the second embodiment.

In the second embodiment, the ferromagnetic layer 2, the nonmagnetic layer 4, the interfacial magnetic layer 6, and the ferromagnetic layer 8 are stacked on the base layer 100 in this order. However, the stacking order may be reversed like a magnetoresistive element according to a modification of the second embodiment shown in FIG. 4. Specifically, the ferromagnetic layer 8, the interfacial magnetic layer 6, the nonmagnetic layer 4, and the ferromagnetic layer 2 may be staked on the base layer 100 in this order.

Third Embodiment

Figure 5:
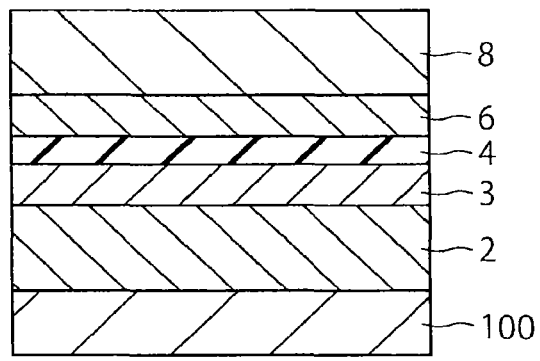
FIG. 5 is a cross-sectional view of a magnetoresistive element according to a third embodiment.

FIG. 5 shows a magnetoresistive element 1B according to a third embodiment. The magnetoresistive element 1B is obtained by disposing an interfacial magnetic layer 3 between the ferromagnetic layer 2 and the nonmagnetic layer 4, and an interfacial magnetic layer 6 between the nonmagnetic layer 4 and the ferromagnetic layer 8 in the magnetoresistive element 1 according to the first embodiment shown in FIG. 1. At least one of the ferromagnetic layer 2, the ferromagnetic layer 8, the interfacial magnetic layer 3, and the interfacial magnetic layer 6 is a magnetic layer containing Mn, Ga, and at least one element from the group of Al, Ge, Ir, Cr, Co, Pt, Ru, Pd, Rh, Ni, Fe, Re, Au, Cu, B, C, P, Gd, Tb, and Dy. The characteristics of the interfacial magnetic layer 3 and the interfacial magnetic layer 6 will be described in detail later.

The magnetoresistive element 1B according to the third embodiment may be not only an in-plane magnetization MTJ element but also a perpendicular magnetization MTJ element, like the first embodiment and the second embodiment.

Furthermore, the interfacial magnetic layer 3 and the interfacial magnetic layer 6 are disposed to increase the spin polarization, as in the first embodiment and the second embodiment.

(Modification)

Figure 6:
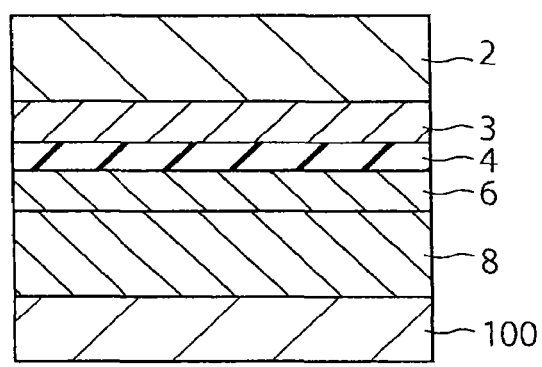
FIG. 6 is a cross-sectional view of a magnetoresistive element according to a modification of the third embodiment.

In the third embodiment, the ferromagnetic layer 2, the interfacial magnetic layer 3, the nonmagnetic layer 4, the interfacial magnetic layer 6, and the ferromagnetic layer 8 are stacked on the base layer 100 in this order. However, the stacking order may be reversed as in a magnetoresistive element according to a modification of the third embodiment shown in FIG. 6. Specifically, the ferromagnetic layer 8, the interfacial magnetic layer 6, the nonmagnetic layer 4, the interfacial magnetic layer 3, and the ferromagnetic layer 2 may be stacked on the base layer 100 in this order.

Fourth Embodiment

Figure 7:
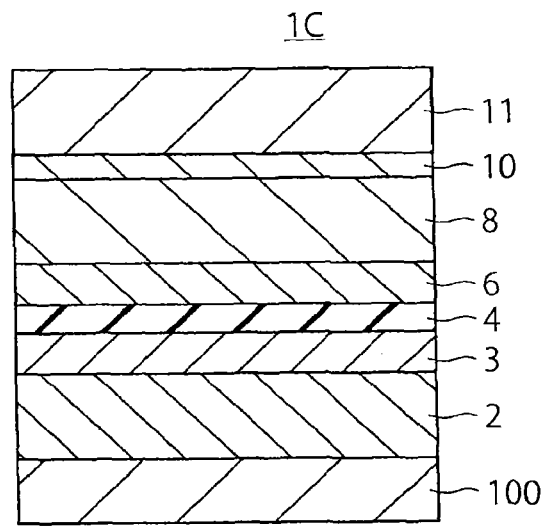
FIG. 7 is a cross-sectional view of a magnetoresistive element according to a fourth embodiment.

FIG. 7 shows a magnetoresistive element 1C according to a fourth embodiment. The magnetoresistive element 1C is obtained by stacking a nonmagnetic layer 10 and a ferromagnetic layer 11 on the ferromagnetic layer 8 of the magnetoresistive element 1B according to the third embodiment shown in FIG. 5. In the fourth embodiment, the interfacial magnetic layer 6 and the ferromagnetic layer 8 serve as a reference layer, for example. The ferromagnetic layer 11 is called a bias layer, and has a magnetization antiparallel (opposite) to the magnetization of the ferromagnetic layer 8. The ferromagnetic layer 11 may be antiferromagnetically coupled to the ferromagnetic layer 8 (synthetic antiferromagnetic coupling; SAF coupling) via the nonmagnetic layer 10. This may reduce or adjust the shift of the switching current of the storage layer including the interfacial magnetic layer 3 and the ferromagnetic layer 2 caused by the stray magnetic field from the reference layer including the interfacial magnetic layer 6 and the ferromagnetic layer 8. The nonmagnetic layer 10 in this embodiment preferably has a heat resistance to prevent the ferromagnetic layer 8 and the ferromagnetic layer 11 from being mixed in a heat treatment, and a function of controlling the crystal orientation of the ferromagnetic layer 11 when the ferromagnetic layer 11 is formed.

If the thickness of the nonmagnetic layer 10 increases, the distance between the ferromagnetic layer 11 and the storage layer (the ferromagnetic layer 2, for example, in the fourth embodiment). This reduces the shift adjustment magnetic field applied from the ferromagnetic layer 11 to the storage layer. Therefore, the thickness of the nonmagnetic layer 10 is preferably 5 nm or less. The ferromagnetic layer 11 may be coupled with the ferromagnetic layer 8 via the nonmagnetic layer 10 by the SAF coupling as described above. In this case, if the nonmagnetic layer 10 is too thick, the magnetic coupling may be cut. Also from this point, the thickness of the nonmagnetic layer 10 is preferably 5 nm or less. The ferromagnetic layer 11 is formed of a ferromagnetic material having an easy magnetization axis perpendicular to the film plane. Since the ferromagnetic layer 11 is more distant from the storage layer than from the reference layer, the thickness or the magnitude of the saturation magnetization Ms of the ferromagnetic layer 11 should be greater than that of the reference layer if the stray magnetic field applied to the storage layer is adjusted by the ferromagnetic layer 11. According to the study of the inventors, the thickness $t_2$ of the reference layer, the saturation magnetization $Ms_2$ of the reference layer, the thickness $t_3$ of the ferromagnetic layer 11, and the saturation magnetization $Ms_3$ of the ferromagnetic layer should meet the following relational expression:

$$Ms_2 \times t_2 < Ms_3 \times t_3$$

The ferromagnetic layer 11 of the fourth embodiment may be applied to the magnetoresistive element according to any of the first to third embodiments. In this case, the ferromagnetic layer 11 is stacked on the ferromagnetic layer to serve as the reference layer with the nonmagnetic layer 10 being disposed therebetween.

(Modification)

Figure 8:
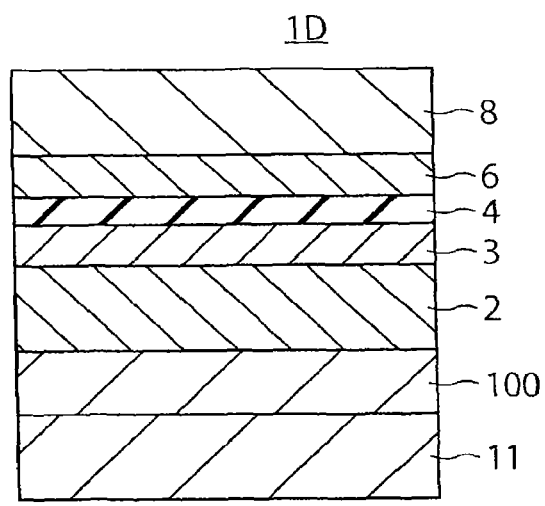
FIG. 8 is a cross-sectional view of a magnetoresistive element according to a modification of the fourth embodiment.
Figure 9:
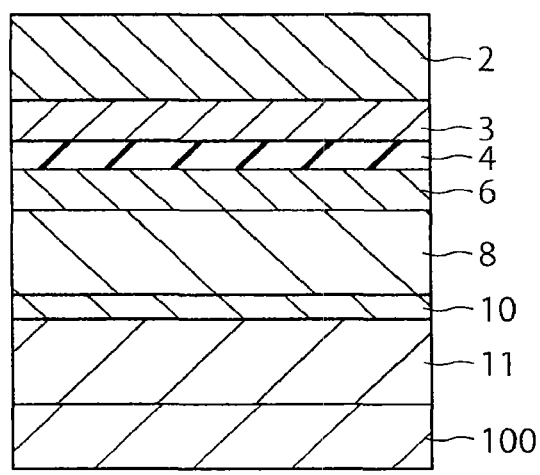
FIG. 9 is a cross-sectional view of a magnetoresistive element according to a further modification of the fourth embodiment.

Although the fourth embodiment has a top bias structure, in which the ferromagnetic layer 2, the interfacial magnetic layer 3, the nonmagnetic layer 4, the interfacial magnetic layer 6, the ferromagnetic layer 8, the nonmagnetic layer 10, and the ferromagnetic layer 11 are stacked on the base layer 100 in this order, the ferromagnetic layer 11 may be stacked below the base layer 100. Specifically, a bottom bias structure may be employed, in which the base layer 100, the ferromagnetic layer 2, the interfacial magnetic layer 3, the nonmagnetic layer 4, the interfacial magnetic layer 6, and the ferromagnetic layer 8 are stacked in this order on the ferromagnetic layer 11 as in a magnetoresistive element 1D according to a modification of the fourth embodiment shown in FIG. 8. In this case, the ferromagnetic layer 2 is preferably used as the reference layer. The order of the stacking may be reversed as in a magnetoresistive element according to a further modification of the fourth embodiment shown in FIG. 9. Specifically, the ferromagnetic layer 11, the nonmagnetic layer 10, the ferromagnetic layer 8, the interfacial magnetic layer 6, the nonmagnetic layer 4, the interfacial magnetic layer 3, and the ferromagnetic layer 2 may be stacked in this order on the base layer 100. In both the modifications, the stray magnetic field to be applied to the storage layer from the ferromagnetic layer 11 needs to be substantially the same as the stray magnetic field to be applied to the storage layer from the reference layer as in the fourth embodiment. Therefore, if the distance between the storage layer and the shift adjustment layer is shorter than the distance between the storage layer and the reference layer, the relational expression (the total magnetization of the shift adjustment layer<the total magnetization of the reference layer) should be met. If the distance between the storage layer and the shift adjustment layer is longer than the distance between the storage layer and the reference layer, the relational expression (the total magnetization of the shift adjustment layer>the total magnetization of the reference layer) should be met.

(MTJ Element Including Magnetic Layer with Single Crystal Structure)

A method of manufacturing an MTJ element including a magnetic layer with a single crystal structure ("single crystal MTJ element") will be described below. It is preferable that in the magnetoresistive element ("MTJ element") according to any of the first to fourth embodiments and their modifications, at least one of the ferromagnetic layer 2, the ferromagnetic layer 8, the interfacial magnetic layer 3, and the interfacial magnetic layer 6 has a single crystal structure. The reason for this is that it may be possible to considerably suppress the variations of magnetic characteristics of a magnetic layer if it has a single crystal structure, in which the crystal orientation in the in-plane direction is along one direction to enhance the magnetic coupling in the layer. Furthermore, since the formation of grain boundary may be curbed, it may be possible to form a magnetic layer or an insulating layer, which is flattened in the atomic level, and which has good crystallinity. Therefore, a magnetoresistive ratio (MR ratio) that is higher than the MR ratios of conventional MTJ elements may be obtained. In order to obtain large-capacity MRAMs of a few tens Gbits, single crystal MTJ elements should be manufactured.

However, generally, the wiring of a circuit has a polycrystalline or amorphous structure, and thus it is not possible to grow a single crystal layer thereon. Accordingly, it is difficult to grow a single crystal MTJ element on a substrate on which transistors are implemented.

However, it is possible to form an MRAM including a single crystal MTJ element by preparing a substrate with a single crystal structure on which a single crystal MTJ element is formed and a substrate on which a transistor is formed, bonding the substrates, and removing the substrate with a single crystal structure, which is unnecessary. This will be described with reference to FIGS. 10A to 11C.

First, an MTJ element according to any of the first to fourth embodiments is formed on a Si single crystal substrate under appropriate growing conditions. For example, as shown in FIG. 10A, a base layer 100, a ferromagnetic layer 2, a nonmagnetic layer 4, and a ferromagnetic layer 8 are formed on a Si single crystal substrate 200 in this order by a sputtering method or MBE (Molecular Beam Epitaxy) method, thereby obtaining an MTJ element 1 of the first embodiment. At this time, the crystallinity of the Si single crystal substrate 200 is conveyed to the base layer 100, the ferromagnetic layer 2, the nonmagnetic layer 4, and the ferromagnetic layer 8, resulting in that the MTJ element 1 formed becomes a single crystal MTJ element 1. Thereafter, a metal bonding layer 20a is formed on the ferromagnetic layer 8 (FIG. 10A). Similarly, a substrate 220, on which a transistor circuit and wiring are formed, is prepared, and a metal bonding layer 20b is formed on the substrate 220 (FIG. 10A). Examples of the materials for forming the metal bonding layers 20a and 20b include Al, Au, Cu, Ti, and Ta.

Next, the substrate 200, on which the single crystal MTJ element 1 is formed, and the substrate 220, on which the transistor circuit is formed, are positioned so that the metal bonding layers 20a and 20b are opposed to each other. Thereafter, as shown in FIG. 10B, the metal bonding layers 20a and 20b are brought into contact with each other. At this time, the metal bonding layers 20a and 20b may be bonded to each other by applying a pressure thereto. When a pressure is applied, the metal bonding layers 20a and 20b may be heated in order to improve the bonding property.

Next, as shown in FIG. 11A, the single crystal substrate 200, on which the single crystal MTJ element 1 is formed, is removed. The removal is performed in such a manner that first the substrate 200 is thinned by a BSG (Back Side Grinding) method, and then the thinned single crystal substrate 200 is mechanically polished and removed by a CMP (Chemical Mechanical Polishing) method or the like as shown in FIG. 11B. The manufacturing of the MTJ element 1 is completed in this manner (FIG. 11C).

As described above, a single crystal MTJ element according to any of the first to fourth embodiments can be formed on a substrate by a manufacturing method including a series of the processes of preparing the single crystal substrate 200 on which a single crystal MTJ element according to any of the first to the fourth embodiments is formed and the substrate 220 on which a transistor circuit is formed, bonding the substrate on which transistors etc. are formed onto the single crystal MTJ element 1, and then removing the single crystal substrate 200 that is unnecessary.

Next, the specific composition of each layer included in the MTJ elements 1, 1A, 1B, 1C, and 1D of the first to fourth embodiments and their modifications will be described in the order of the ferromagnetic layer 2, the ferromagnetic layer 8, the base layer 100, the nonmagnetic layer 4, the interfacial magnetic layer 3, and the interfacial magnetic layer 6. It is assumed in the specific examples that the ferromagnetic layer 2 serves as the storage layer, the ferromagnetic layer 8 serves as the reference layer, the interfacial magnetic layer 3 is disposed on the storage layer side, and the interfacial magnetic layer 6 is disposed on the reference layer side. However, the storage layer may not always be disposed below the multilayer structure. Therefore, the ferromagnetic layer 2 may serves as the reference layer, the ferromagnetic layer 8 may serve as the storage layer, the interfacial magnetic layer 3 may be disposed on the reference layer side, and the interfacial magnetic layer 6 may be disposed on the storage layer side.

(Ferromagnetic Layer 2)

In order to have a perpendicular magnetization and to achieve both a high thermal stability and a low-current magnetization switching, the ferromagnetic layer 2 is preferably formed of a magnetic material with a low saturation magnetization Ms, a high magnetic anisotropy energy Ku that is sufficient to maintain the thermal stability factor $\Delta$, and a lower coercive force, anisotropy magnetic field, or Gilbert damping constant than the magnetic material used to form the ferromagnetic layer 8. Furthermore, the magnetic material of the ferromagnetic layer 2 preferably has a high polarizability.

The foregoing characteristics will be specifically described below.

A first specific example of the ferromagnetic layer 2 is a magnetic layer containing Mn, Ga, and at least one of Al, Ge, Ir, Cr, Co, Pt, Ru, Pd, Rh, Ni, Fe, Re, Au, Cu, B, C, P, Gd, Tb, and Dy. Examples of such a material include MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

Figure 12A:
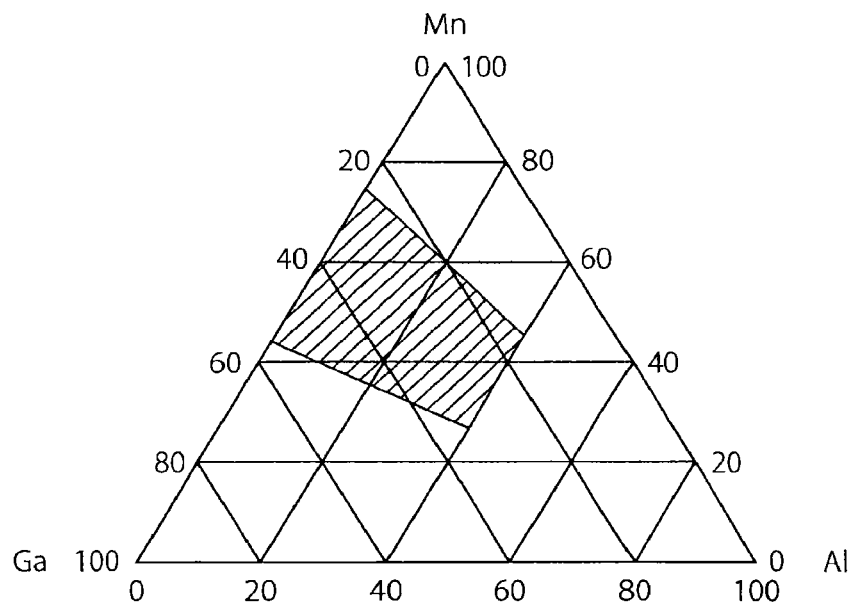
FIG. 12A is an explanatory diagram illustrating a preferable composition range of MnGaAl.

A MnGaAl alloy has characteristics to serve as a perpendicular magnetization film in a composition range expressed as $(Mn_xGa_y)_{100-z}Al_z$ (45 atm %≤x≤75 atm %, 25 atm %≤y≤55 atm %, x+y=100 atm %, 0 atm %<z≤40 atm %) which means $Mn_xGa_y$ (45 atm %≤x≤75 atm %, 25 atm %≤y≤55 atm %, x+y=100 atm %) containing more than 0 atm % but 40 atm % or less of Al. This composition range is indicated by a hatched region in FIG. 12A. The MnGaAl alloy has a magnetization along a specific crystal orientation, and may achieve a lower coercive force, anisotropy magnetic field, or Gilbert damping constant than the material of the ferromagnetic layer 8 by changing the producing conditions. The MnGaAl alloy may be considered as an alloy of tetragonal MnGa and tetragonal MnAl in the composition range of $(Mn_xGa_y)_{100-z}Al_z$ (45 atm %≤x≤55 atm %, 45 atm %≤y≤55 atm %, x+y=100 atm %, 0 atm %<z≤40 atm %). The MnGaAl alloy may have a high polarizability and a low Gilbert damping constant by adjusting its composition, and therefore is more suitable to form a storage layer.

Figure 12B:
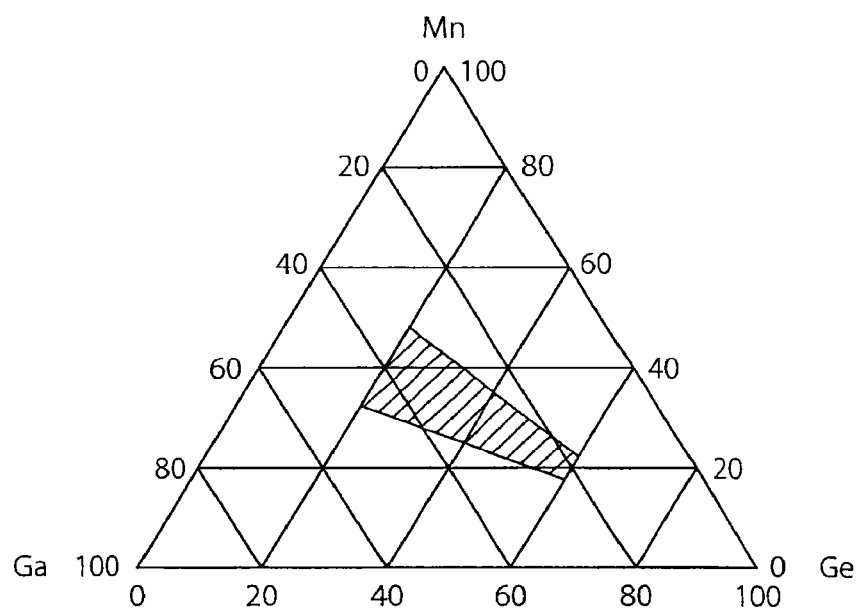
FIG. 12B is an explanatory diagram illustrating a preferable composition range of MnGaGe.

A MnGaGe alloy has characteristics to serve as a perpendicular magnetization film in a composition range expressed as $(Mn_xGa_y)_{100-z}Ge_z$ (45 atm %≤x≤55 atm %, 45 atm %≤y≤55 atm %, x+y=100 atm %, 20 atm %≤z≤60 atm %), which means $Mn_xGa_y$ (45 atm %≤x≤55 atm %, 45 atm %≤y≤55 atm %, x+y=100 atm %) containing 20 atm % or more and 60 atm % or less of Ge. This composition range is indicated by a hatched region in FIG. 12B. The MnGaGe alloy has a magnetization along a specific crystal orientation, and may achieve a lower coercive force, anisotropy magnetic field, or Gilbert damping constant than the material of the ferromagnetic layer 8 by changing the producing conditions in a wide range.

Figure 12C:
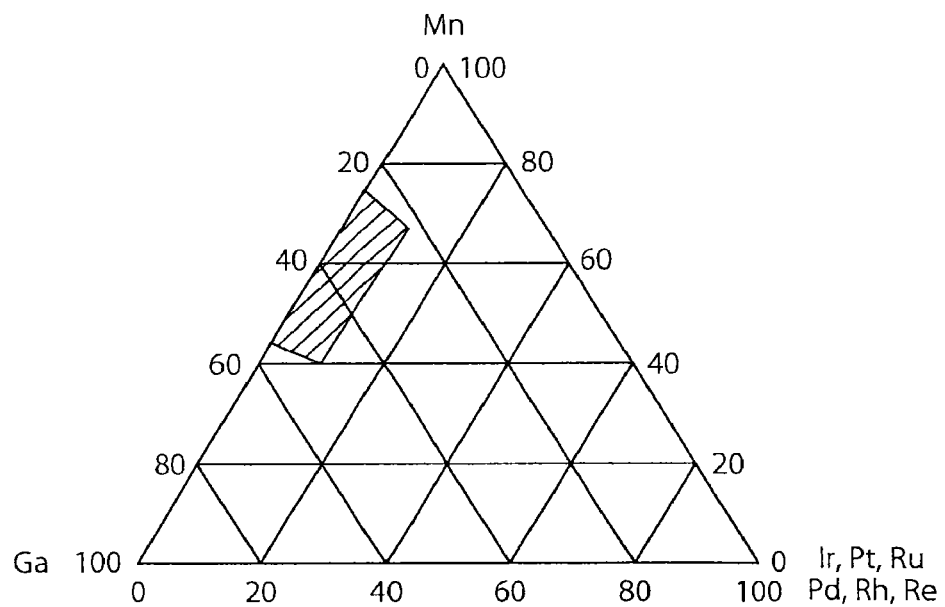
FIG. 12C is an explanatory diagram illustrating a preferable composition range of MnGaIr, MnGaPt, MnGaRu, MnGaPd, MnGaRh, and MnGaRe.

Each of a MnGaIr alloy, a MnGaPt alloy, a MnGaRu alloy, a MnGaPd alloy, a MnGaRh alloy, and a MnGaRe alloy has characteristics to serve as a perpendicular magnetization film in a composition range expressed as, for example, $(Mn_xGa_y)_{100-z}Ir_z$, $(Mn_xGa_y)_{100-z}Pt_z$, $(Mn_xGa_y)_{100-z}Ru_z$, $(Mn_xGa_y)_{100-z}Pd_z$, $(Mn_xGa_y)_{100-z}Rh_z$, and $(Mn_xGaO_{100-z}Re_z$ (45 atm %≤x≤75 atm %, 25 atm %≤y≤55 atm %, x+y=100 atm %, 0 atm %<z≤10 atm %), which means $Mn_xGa_y$ (45 atm %≤x≤75 atm %, 25 atm %≤y≤55 atm %, x+y=100 atm %) containing more than 0 atm % but 10 atm % or less of at least one element from the group of Ir, Pt, Ru, Pd, Rh, and Re. This composition range is indicated by a hatched region in FIG. 12C. Each of the MnGaIr alloy, the MnGaPt alloy, the MnGaRu alloy, the MnGaPd alloy, the MnGaRh alloy, and the MnGaRe alloy has a magnetization along a specific crystal orientation, and may achieve a lower coercive force, anisotropy magnetic field, or Gilbert damping constant than the material of the ferromagnetic layer 8 by changing the producing conditions.

Figure 13A:
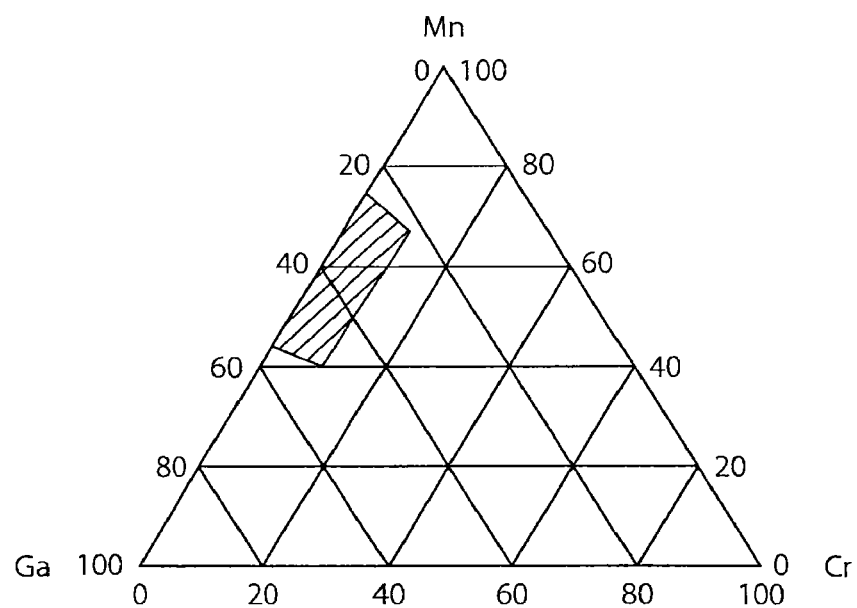
FIG. 13A is an explanatory diagram illustrating a preferable composition range of MnGaCr.

A MnGaCr alloy has characteristics to serve as a perpendicular magnetization film in a composition range expressed as $(Mn_xGa_y)_{100-z}Cr_z$ (45 atm %≤x≤75 atm %, 25 atm %≤y≤55 atm %, x+y=100 atm %, 0 atm %<z≤x≤10 atm %), which means $Mn_xGa_y$ (45 atm %≤x≤75 atm %, 25 atm %≤y≤55 atm %, x+y=100 atm %) containing more than 0 atm % but 10 atm % or less of Cr. This composition range is indicated by a hatched region in FIG. 13A. The MnGaCr alloy has a magnetization along a specific crystal orientation, and may achieve a lower coercive force, anisotropy magnetic field, or Gilbert damping constant than the material of the ferromagnetic layer 8 by changing the producing conditions.

Figure 13B:
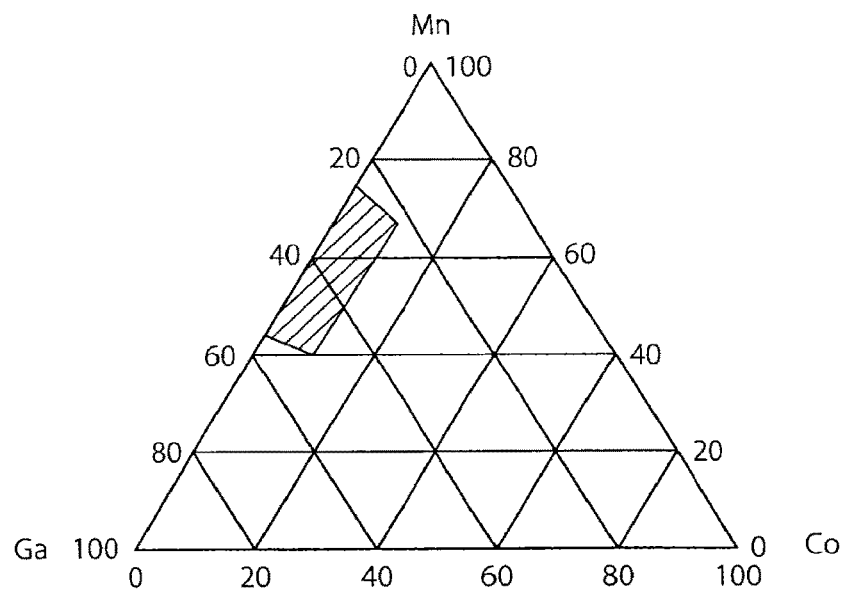
FIG. 13B is an explanatory diagram illustrating a preferable composition range of MnGaCo.

A MnGaCo alloy has characteristics to serve as a perpendicular magnetization film in a composition range expressed as $(Mn_xGa_y)_{100-z}Co_z$ (45 atm %≤x≤75 atm %, 25 atm %, x+y=100 atm %, 0 atm %<z≤10 atm %), which means $Mn_xGa_y$ (45 atm %≤x≤75 atm %, 25 atm %≤y≤55 atm %, x+y=100 atm %) containing more than 0 atm % but 10 atm % or less of Co. This composition range is indicated by a hatched region in FIG. 13B. The MnGaCo alloy has a magnetization along a specific crystal orientation, and may achieve a lower coercive force, anisotropy magnetic field, or Gilbert damping constant than the material of the ferromagnetic layer 8 by changing the producing conditions.

Figure 13C:
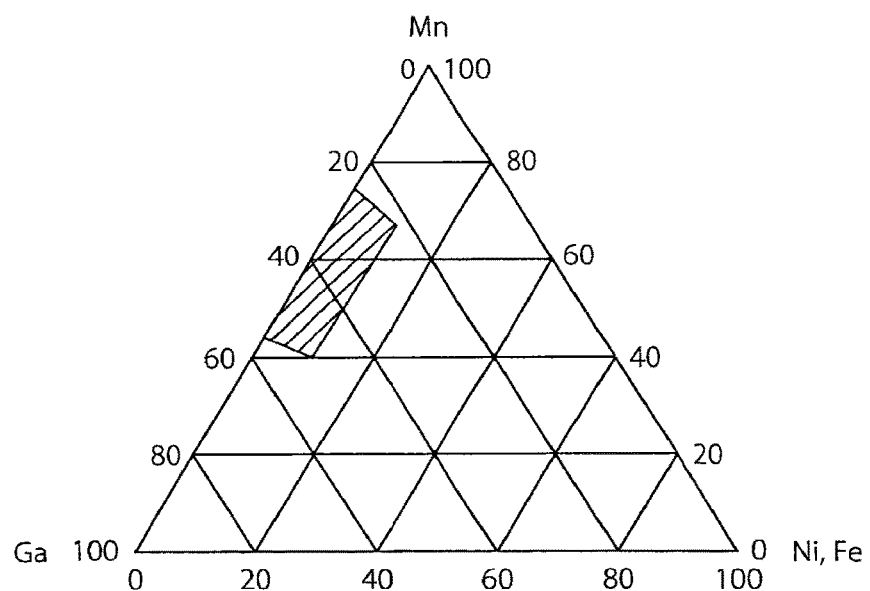
FIG. 13C is an explanatory diagram illustrating a preferable composition range of MnGaNi, MnGaFe.

Each of a MnGaNi alloy and a MnGaFe alloy has characteristics to serve as a perpendicular magnetization film in a composition range expressed as, for example, $(Mn_xGa_y)_{100-z}Ni_z$ or $(Mn_xGa_y)_{100-z}Fe_z$ (45 atm %≤x≤75 atm %, 25 atm %≤y≤55 atm %, x+y=100 atm %, 0 atm %<z≤10 atm %), which means $Mn_xGa_y$ (45 atm %≤x≤75 atm %, 25 atm %≤y≤55 atm %, x+y=100 atm %) containing more than 0 atm % but 10 atm % or less of Ni or Fe. This composition range is indicated by a hatched region in FIG. 13C. Each of the MnGaNi alloy and the MnGaFe alloy has a magnetization along a specific crystal orientation, and may achieve a lower coercive force, anisotropy magnetic field, or Gilbert damping constant than the material of the ferromagnetic layer 8 by changing the producing conditions.

Figure 14A:
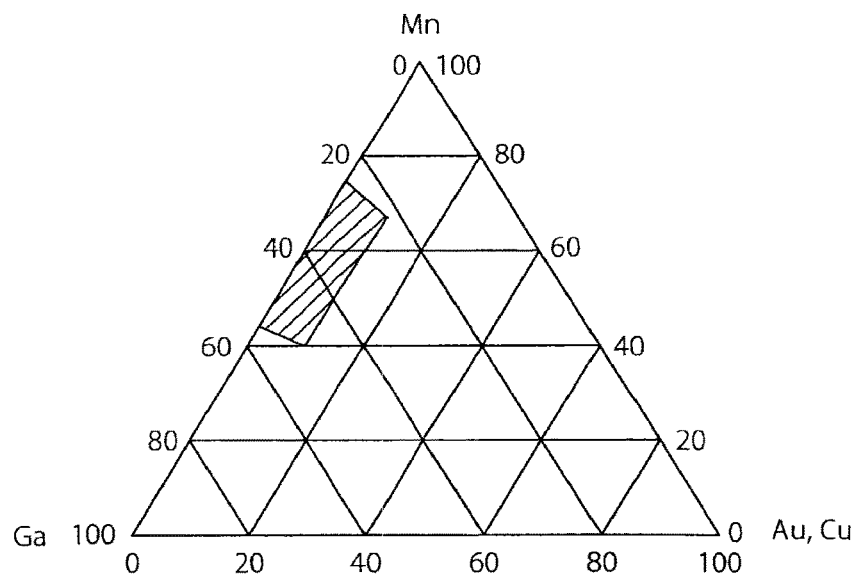
FIG. 14A is an explanatory diagram illustrating a preferable composition range of MnGaAu, MnGaCu.

Each of a MnGaAu alloy and a MnGaCu alloy has characteristics to serve as a perpendicular magnetization film in a composition range expressed as, for example, $(Mn_xGa_y)_{100-z}Au_z$ or $(Mn_xGa_y)_{100-z}Cu_z$ (45 atm %≤x≤75 atm %, 25 atm %≤y≤55 atm %, x+y=100 atm %, 0 atm %<z≤10 atm %), which means $Mn_xGa_y$ (45 atm %≤x≤75 atm %, 25 atm %≤y≤55 atm %, x+y=100 atm %) containing more than 0 atm % but 10 atm % or less of Au or Cu. This composition range is indicated by a hatched region in FIG. 14A. Each of the MnGaAu alloy and the MnGaCu alloy has a magnetization along a specific crystal orientation, and may achieve a lower coercive force, anisotropy magnetic field, or Gilbert damping constant than the material of the ferromagnetic layer 8 by changing the producing conditions.

Figure 14B:
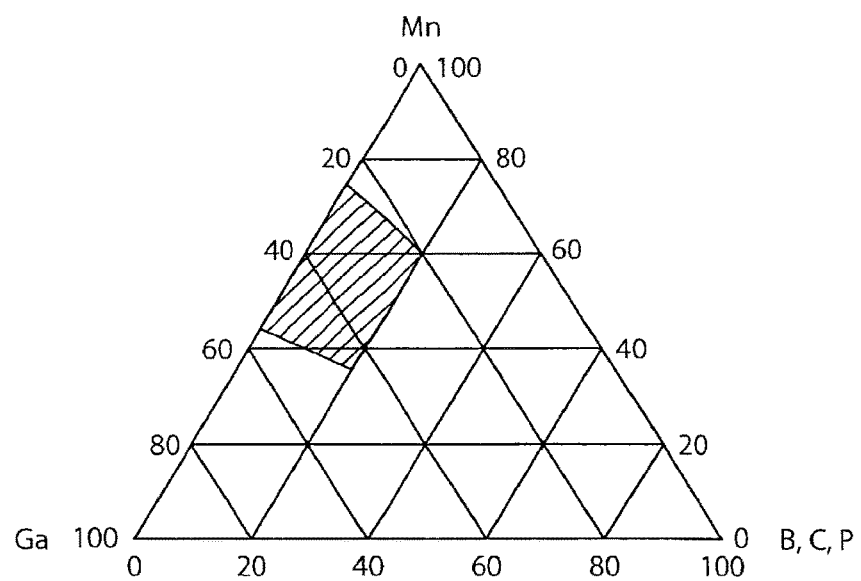
FIG. 14B is an explanatory diagram illustrating a preferable composition range of MnGaB, MnGaC and MnGaP.

Each of a MnGaB alloy, a MnGaC alloy, and a MnGaP alloy has characteristics to serve as a perpendicular magnetization film in a composition range expressed as, for example, $(Mn_xGa_y)_{100-z}B_z$, $(Mn_xGa_y)_{100-z}C_z$, or $(Mn_xGa_y)_{100-z}P_z$ (45 atm %≤x≤75 atm %, 25 atm %≤y≤55 atm %, x+y=100 atm %, 0 atm %<z<20 atm %), which means $Mn_xGa_y$ (45 atm %≤x≤75 atm %, 25 atm %≤y≤55 atm %, x+y=100 atm %) containing more than 0 atm % but less than 20 atm % of at least one element from B, C, and P. If the content of any of B, C, and P is 20 atm % or more, the magnetic material may have a perovskite crystal structure, and therefore may lose the characteristics to serve as a perpendicular magnetization film. The above composition range is indicated by a hatched region in FIG. 14B. Each of the MnGaB alloy, the MnGaC alloy, and the MnGaP alloy has a magnetization along a specific crystal orientation, and may achieve a lower coercive force, anisotropy magnetic field, or Gilbert damping constant than the material of the ferromagnetic layer 8 by changing the producing conditions.

Figure 14C:
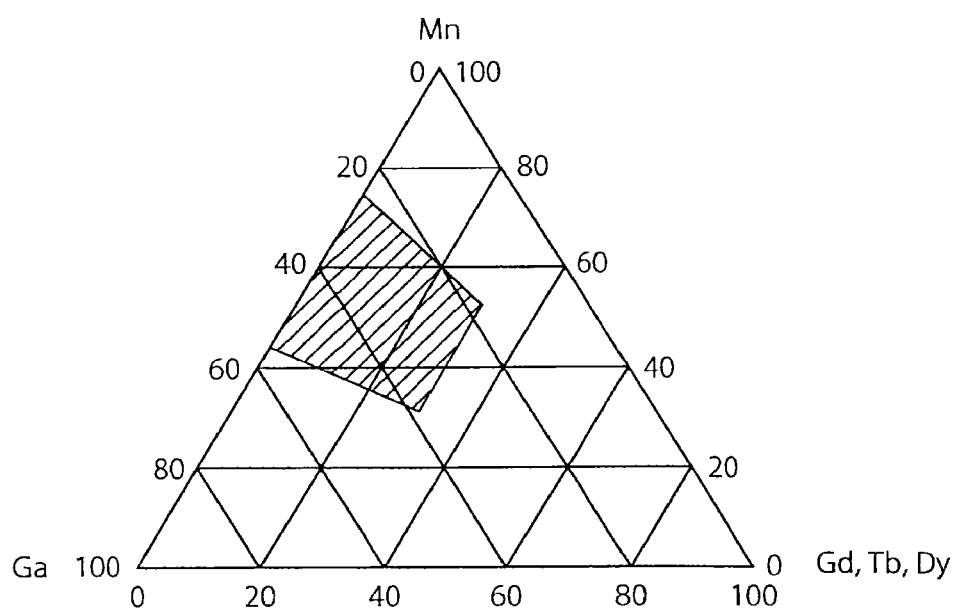
FIG. 14C is an explanatory diagram illustrating a preferable composition range of MnGaGd, MnGaTb, and MnGaDy.

Each of a MnGaGd alloy, a MnGaTb alloy, and a MnGaDy alloy has characteristics to serve as a perpendicular magnetization film in a composition range expressed as, for example, $(Mn_xGa_y)_{100-z}Gd_z$, $(Mn_xGa_y)_{100-z}Tb_z$, or $(Mn_xGa_y)_{100-z}Dy_z$ (45 atm %≤x≤75 atm %, 25 atm %≤y≤55 atm %, x+y=100 atm %, 0 atm %<z≤30 atm %), which means $Mn_xGa_y$ (45 atm %≤x≤75 atm %, 25 atm %≤y≤55 atm %, x+y=100 atm %) containing more than 0 atm % but 30 atm % or less of at least one element from Gd, Tb, and Dy. This composition range is indicated by a hatched region in FIG. 14C. Each of the MnGaGd alloy, the MnGaTb alloy, and the MnGaDy alloy have a magnetization along a specific crystal orientation, and may achieve a lower coercive force, anisotropy magnetic field, or Gilbert damping constant than the material of the ferromagnetic layer 8 by changing the producing conditions.

A second specific example of the material of the ferromagnetic layer 2 is an alloy containing one element from the group of Mn, Fe, Co, and Ni and two elements from the group of Zn, Al, Ga, In, Si, Ge, Sn, As, Sb, and Bi. Specifically, the second specific example may include MnAlGe and MnZnSb.

In order to have the perpendicular magnetic anisotropy, the c-axis of the aforementioned materials should be (001) oriented to be perpendicular to the film plane. Specifically, the crystal orientation of the ferromagnetic layer 2 may be controlled by appropriately selecting the material of the base layer 100. The details of the base layer 100 will be described later.

A third specific example of the material of the ferromagnetic layer 2 is an alloy containing at least one metal from the group of Fe and Co. At least one element from the group of Ni, B, C, P, Ta, Ti, Mo, Si, W, Nb, Mn, and Ge may be added to the alloy in order to control the saturation magnetization of the ferromagnetic layer 2. Therefore, the ferromagnetic layer 2 may be formed of an alloy containing at least one of Fe and Co and at least one of Ni, B, C, P, Ta, Ti, Mo, Si, W, Nb, Mn, and Ge. Examples of such a material include CoFeSi, CoFeP, CoFeW, and CoFeNb besides CoFeB.

(Ferromagnetic Layer 8)

The ferromagnetic layer 8 preferably has an easy magnetization axis perpendicular to the film plane, and is formed of a magnetic material with a low saturation magnetization Ms, a high magnetic anisotropy energy Ku that is sufficient to maintain the thermal stability factor Δ, and a higher coercive force, anisotropy magnetic field, or Gilbert damping constant than the material used to form the ferromagnetic layer 2. Furthermore, the magnetic material of the ferromagnetic layer 8 preferably has a high polarizability.

The foregoing characteristics will be specifically described below.

A first specific example of the ferromagnetic layer 8 is a MnGaX magnetic film containing Mn, Ga, and at least one element from the group of Al, Ge, Ir, Cr, Co, Pt, Ru, Pd, Rh, Ni, Fe, Re, Au, Cu, B, C, P, Gd, Tb, and Dy. Specifically, MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy are included in the first specific example.

The magnetization of a MnGaX alloy, which has a high crystalline magnetic anisotropy, has a specific crystal orientation. The degree of crystalline magnetic anisotropy can be controlled by changing the composition ratio or the crystallinity of the elements included in the MnGaX alloy. Therefore, the direction of magnetization of the MnGaX alloy can be controlled by changing the direction along which crystal grows. Since the MnGaX alloy has a high crystalline magnetic anisotropy, the aspect ratio of the device may be controlled. Furthermore, since the MnGaX alloy has a high thermal stability, it is suitable for integration.

A MnGaAl alloy has characteristics to serve as a perpendicular magnetization film in a composition range expressed as $(Mn_xGa_y)_{100-z}Al_z$ (45 atm %≤x≤75 atm %, 25 atm %≤y≤55 atm %, x+y=100 atm %, 0 atm %<z≤40 atm %), which means $Mn_xGa_y$ (45 atm %≤x≤75 atm %, 25 atm %≤y≤55 atm %, x+y=100 atm %) containing more than 0 atm % but 40 atm % or less of Al. In particular, the MnGaAl alloy may be regarded as an alloy of tetragonal MnGa and tetragonal MnAl in the composition range expressed as $(Mn_xGa_y)_{100-z}Al_z$ (45 atm %≤y≤55 atm %, 45 atm %≤y≤55 atm %, x+y=100 atm %, 0 atm %<z≤40 atm %). Therefore, the polarizability and the Gilbert damping constant of the MnGaAl alloy are expected to be adjusted by changing the composition ratio.

Figure 15A:
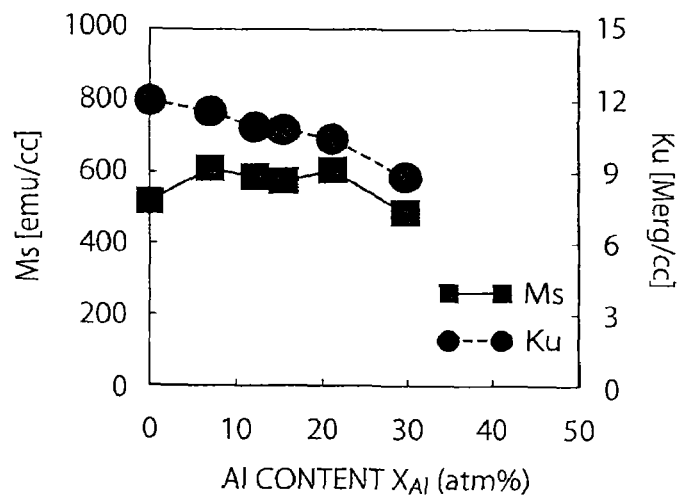
FIG. 15A shows an example of the dependency of the magnetic characteristics on the Al content in a MnGaAl alloy.
Figure 15B:
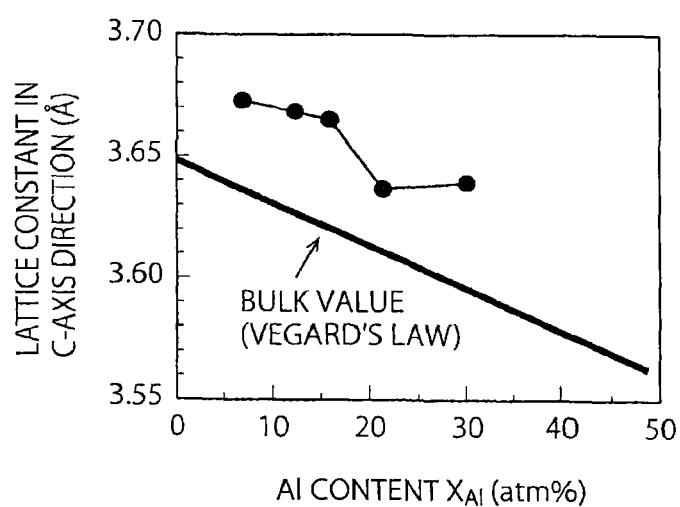
FIG. 15B shows an example of the dependency of the lattice constant of the c axis on the Al content in a MnGaAl alloy.
Figure 16A:
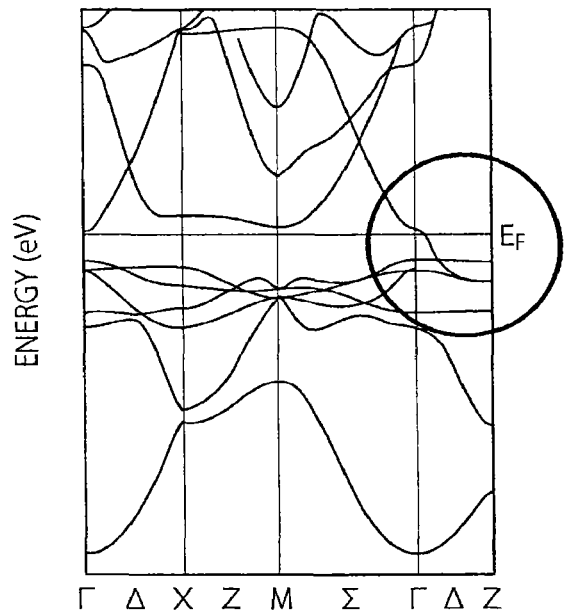
FIGS. 16A and 16B show the majority state and the minority state in a calculated band structure of a bulk MnGaAl alloy, respectively.
Figure 16B:
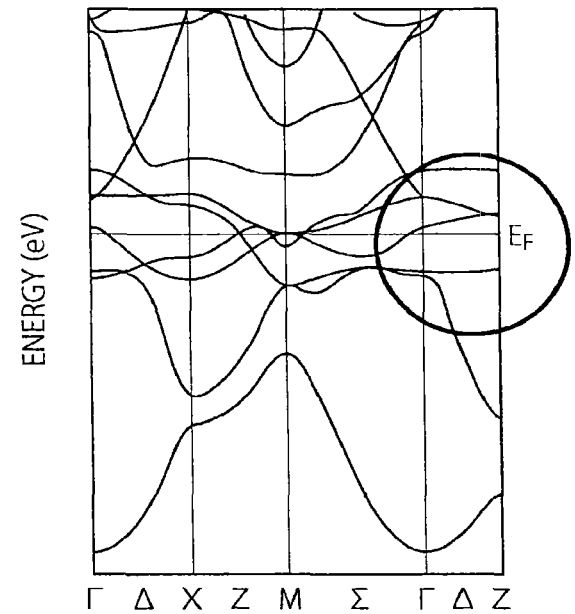

FIGS. 15A and 15B show a first example, which is $(Mn_{55}Ga_{45})_{100-z}Al_z$ (0 atm %<z≤40 atm %) formed on MgO(001). FIG. 15A shows the dependency of the saturation magnetization Ms and the magnetic anisotropy energy Ku of this alloy on the Al content $X_{Al}$, and FIG. 15B shows the dependency of the lattice constant in the c-axis direction of this alloy, obtained by the x-ray diffraction, on the Al content $X_{Al}$. The values of the Al content $X_{Al}$ in FIGS. 15A and 15B are calculated by inductively-coupled plasma (ICP) emission spectrometry. It is confirmed that MnGaAl with highly (001)-orientated crystal may be produced by depositing this alloy in a heat treatment on orientation-controlled MgO. The saturation magnetization Ms of MnGaAl thus obtained is as low as 482 (emu/cc) to 613 (emu/cc), and the perpendicular magnetic anisotropy energy Ku thereof is as high as $8.7 \times 10^6$ (erg/cc) to $11.5 \times 10^6$ (erg/cc). Thus, it is confirmed that MnGaAl obtained meets the characteristics to serve as a reference layer (see FIG. 15A). It can be understood from FIG. 15B that the lattice constant of the c-axis of MnGaAl varies in accordance with the Vegard's law. The shift of measured values from the bulk values shown in FIG. 15B are considered to be resulted from the strains caused by thinning the layer. Thus, MnGaAl may be expected to exist as an alloy of tetragonal MnGa and tetragonal MnAl. Therefore, various characteristics including the saturation magnetization, the perpendicular magnetic anisotropy, the Gilbert damping constant, and the polarizability thereof may be controlled by the Al content. FIGS. 16A and 16B each show the band structure of MnGaAl obtained by the first principles calculation. FIG. 16A shows the majority state, and FIG. 16B shows the minority state. As shown in FIGS. 16A and 16B, when the lattice constant is modified from the MnGa side to the MnAl in an optimum composition, the Δ1 band crosses the Fermi energy $E_F$ in the majority state, but does not cross the Fermi energy $E_F$ in the minority state. This means that the spin of the electrons moving along the c-axis direction can be completely polarized. As a result, the characteristic of an ideal Δ1 band half metal can be achieved, and thus a high polarizability can be expected.

Figure 18A:
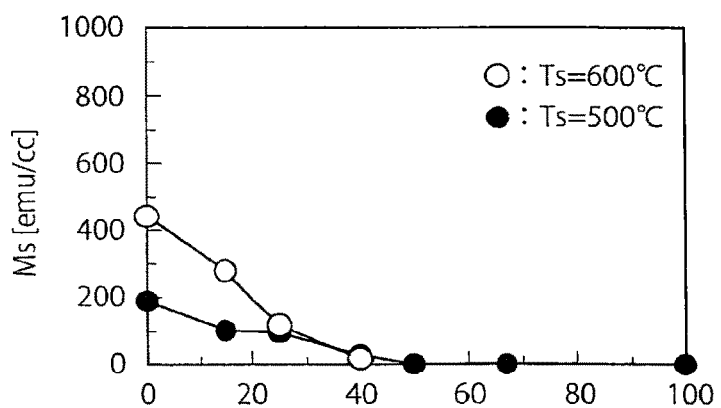
FIGS. 18A and 18B show examples of the dependency of the magnetic characteristics of a MnGaAl alloy on the Al content.
Figure 18B:
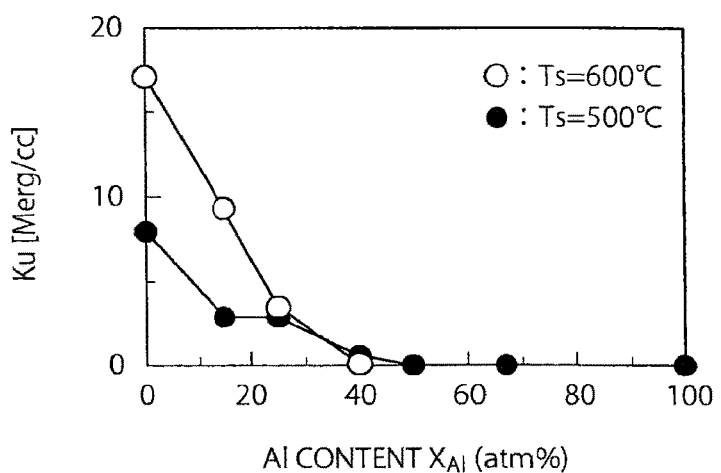

FIGS. 17A to 17C, 18A, and 18B show a second example, which is $(Mn_{63}Ga_{37})_{100-z}Al_z$ (0 atm %<z≤40 atm %) formed on MgO(001). FIGS. 17A to 17C show magnetization curves of the alloys with different Al contents, and FIGS. 18A and 18B show the magnetic characteristics of the alloys. In each of FIGS. 17A to 17C, $g_1$ represents a magnetization curve in a case where a magnetic field is applied in a direction parallel to the film plane of MnGaAl, and $g_2$ represents magnetization curves in a case where a magnetic field is applied in a direction perpendicular to the film plane of MnGaAl. It is confirmed that if the Al content is 15%, for example, the saturation magnetization Ms is as low as 275 (emu/cc) and the perpendicular magnetic anisotropy energy Ku is as high as $9.4 \times 10^6$ (erg/cc) as shown in FIGS. 18A and 18B. This meets the characteristics required to serve as a reference layer. As can be understood from FIGS. 17B and 17C, the upper limit of the amount of added Al (Al content) $X_{Al}$ for allowing the MnGaAl layer to serve as a perpendicular magnetization film is in the range of 40 to 50 atm %.

From the foregoing, if the low Gilbert damping constant and the high polarizability are regarded as important factors among the characteristics of the reference layer, the composition range expressed as $(Mn_xGa_y)_{100-z}Al_z$ (45 atm %≤x≤55 atm %, 45 atm %≤y≤55 atm %, x+y=100 atm %, 0 atm %<z≤40 atm %) is more preferable, and if the low saturation magnetization and the high perpendicular magnetic anisotropy are regarded as important factors, the composition range expressed as $(Mn_xGa_y)_{100-z}Al_z$ (63 atm %≤x≤75 atm %, 25 atm %≤y≤37 atm %, x+y=100 atm %, 0 atm %<z≤40 atm %) is more preferable.

An MnGaGe alloy has characteristics to serve as a perpendicular magnetization film in a composition range expressed as $(Mn_xGa_y)_{100-z}Ge_z$ (45 atm %≤x≤55 atm %, 45 atm %≤y≤55 atm %, x+y=100 atm %, 20 atm %≤z≤60 atm %), which means $Mn_xGa_y$ (45 atm %≤x≤55 atm %, 45 atm %≤y≤55 atm %, x+y=100 atm %) containing 20 atm % or more and 60 atm % or less of Ge.

Figure 19A:
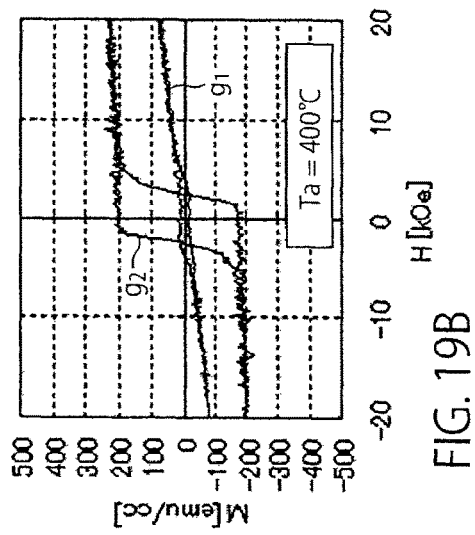
FIGS. 19A to 19C show examples of the magnetization curves in a MnGaGe alloy.
Figure 19B:
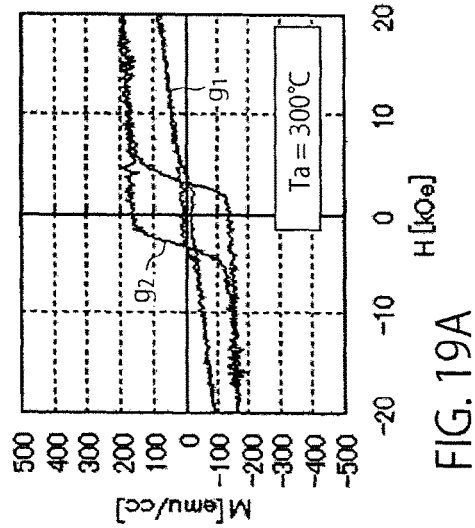
Figure 19C:
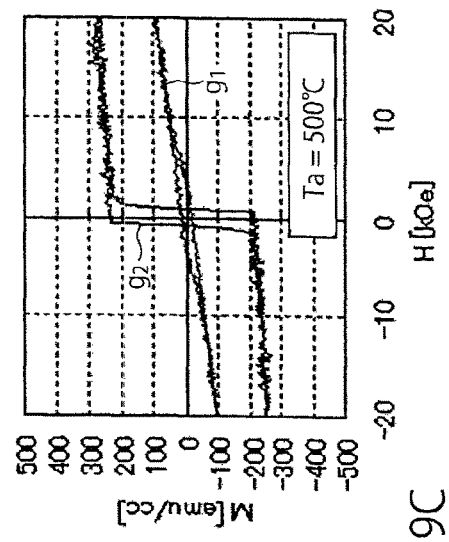

FIG. 19A, FIG. 19B, and FIG. 19C disclose examples of magnetization curves of $Mn_{37}Ga_{31}Ge_{32}$ formed on MgO (001) at heat treatment temperatures Ta of 300° C., 400° C., and 500° C., respectively. In each of FIGS. 19A to 19C, $g_1$ represents a magnetization curve in a case where a magnetic field is applied in a direction parallel to the film plane of MnGaGe, and $g_2$ represents magnetization curves in a case where a magnetic field is applied in a direction perpendicular to the film plane of MnGaGe. The MnGaGe layers are deposited in a room temperature and subjected to post annealing. In each heat treatment, MnGaGe with a low saturation magnetization and a high perpendicular magnetic anisotropy is obtained. As can be understood from FIG. 19C, the MnGaGe layer after the heat treatment at a temperature of 500° C. has a saturation magnetization Ms as low as 260 (emu/cc), and a perpendicular magnetic anisotropy energy Ku as high as $7.4 \times 10^6$ (erg/cc), and thus meets the requirements to serve as a reference layer.

Figure 20:
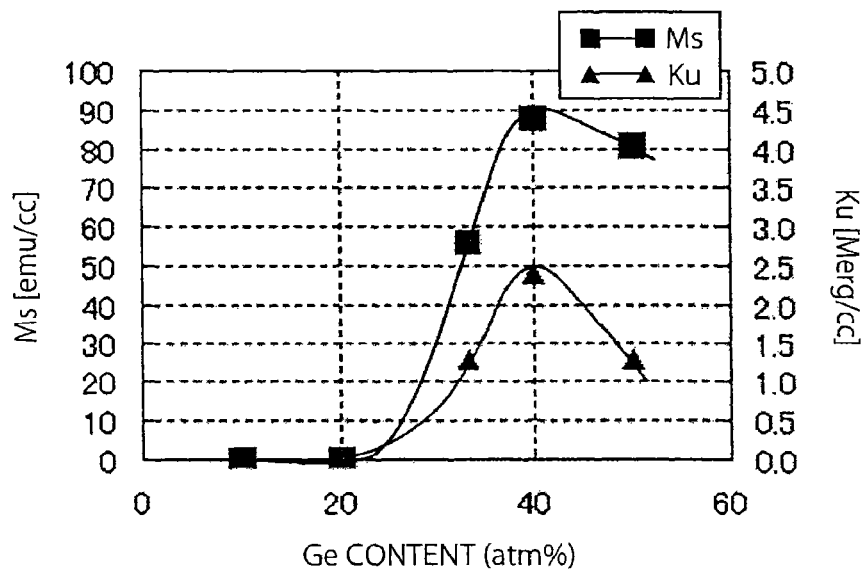
FIG. 20 shows an example of the dependency of the magnetic characteristic of a MnGaGe alloy on the Ge content.

FIG. 20 shows a result of measurements of the saturation magnetization Ms and the magnetic anisotropy energy for MnGaGe layers with different Ge contents. As can be understood from FIG. 20, in order to serve as a perpendicular magnetization film, a MnGaGe layer has a Ge content in a range from 20 atm % to 60 atm %. The MnGaGe layer with 20 to 60 atm % nonmagnetic element Ge has a robust characteristic in composition to serve as a perpendicular magnetization film, and an easy-manufacture characteristic to be formed by post annealing after the deposition at a room temperature.

Each of a MnGaIr alloy, a MnGaPt alloy, a MnGaRu alloy, a MnGaPd alloy, a MnGaRh alloy, and a MnGaRe alloy has characteristics to serve as a perpendicular magnetization film in a composition range expressed as, for example, $(Mn_xGa_y)_{100-z}Ir_z$, $(Mn_xGa_y)_{100-z}Pt_z$, $(Mn_xGa_y)_{100-z}Ru_z$, $(Mn_xGa_y)_{100-z}Pd_z$, $(Mn_xGa_y)_{100-z}Rh_z$, or $(Mn_xGa_y)_{100-z}Re_z$ (45 atm %≤z≤75 atm %, 25 atm %≤y≤55 atm %, x+y=100 atm %, 0 atm %<z≤10 atm %), which means $Mn_xGa_y$ (45 atm %≤x≤75 atm %, 25 atm %≤y≤55 atm %, x+y=100 atm %) containing more than 0 atm % but 10 atm % or less of one element selected from Ir, Pt, Ru, Pd, Rh, and Re.

Figure 21:
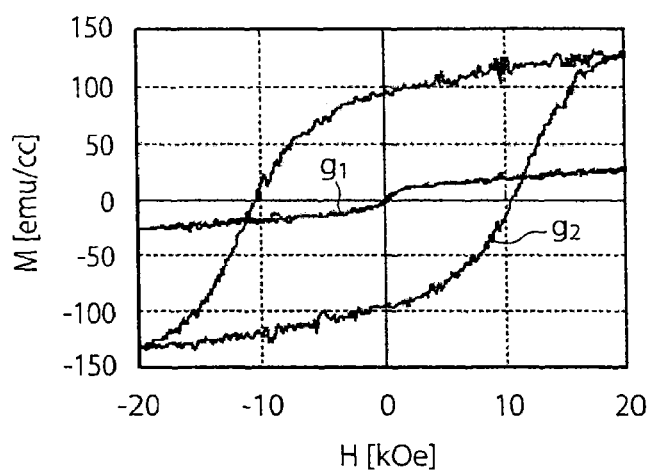
FIG. 21 shows an example of the magnetization curves of a MnGaIr alloy.

FIG. 21 shows an example of magnetization curves of $Mn_{68}Ga_{30}Ir_2$ formed on MgO(001). The MnGaIr layer is obtained by a heat treatment. In FIG. 21, $g_1$ represents a magnetization curve in a case where a magnetic field is applied in a direction parallel to the film plane of MnGaIr, and $g_2$ represents magnetization curves in a case where a magnetic field is applied in a direction perpendicular to the film plane of MnGaIr. The saturation magnetization Ms of MnGaIr is as low as 128 (emu/cc), and the perpendicular magnetic anisotropy Ku thereof is as high as $5.3 \times 10^6$ (erg/cc). Thus, it is confirmed that the MnGaIr alloy meets the characteristics to serve as a reference layer.

The Gilbert damping constant generally correlates to the magnitude of spin orbit interaction, and a material with a higher atom number has a greater spin orbit interaction and a greater Gilbert damping constant. MnGaPt, MnGaIr, MnGaRe, MnGaPd, MnGaRh, and MnGaRu, which include heavy elements Pt, Ir, Re, Pd, Rh, and Ru, are expected to have a high Gilbert damping constant, and therefore are preferable to be used to form a reference layer.

Figure 22A:
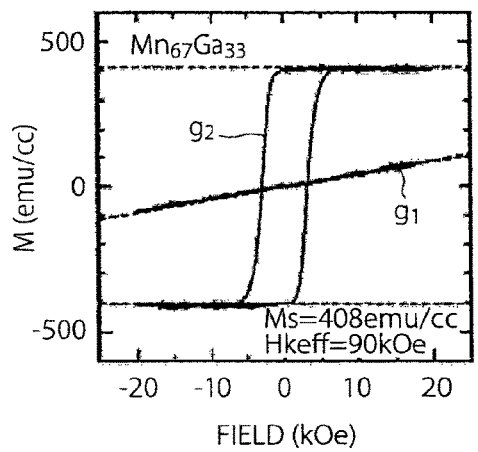
FIGS. 22A to 22D show examples of the magnetization curves of MnGaPt alloys.
Figure 22B:
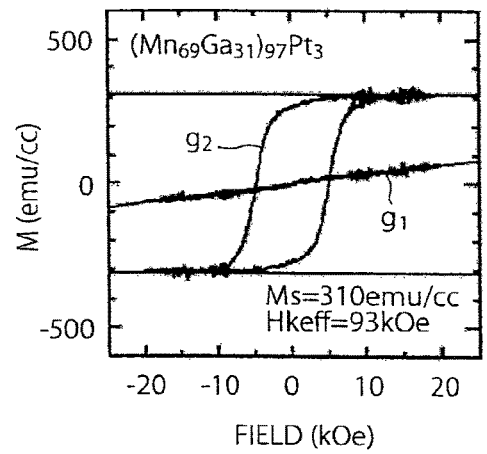
Figure 22C:
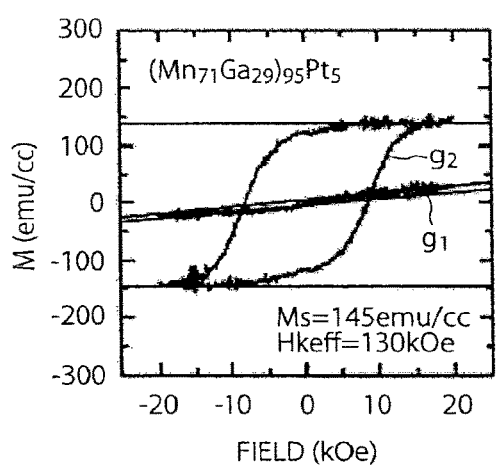
Figure 22D:
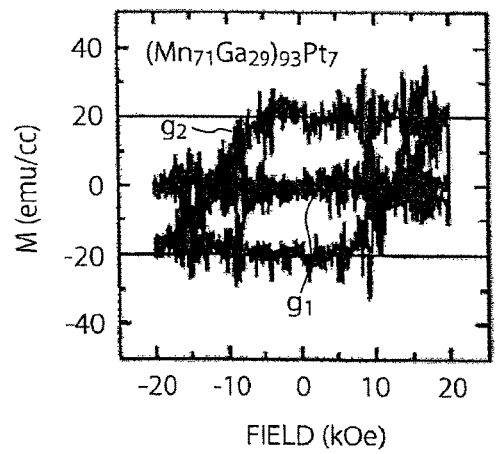

FIGS. 22A to 22D shows examples of magnetization curves of $(MnGa)_{100-z}Pt_z$ formed on MgO(001). FIG. 22A, FIG. 22B, FIG. 22C, and FIG. 22D show magnetization curves in cases where the Pt content z is 0 atm %, 3 atm %, 5 atm %, and 7 atm %, respectively. Specifically, FIG. 22A shows magnetization curves of $Mn_{67}Ga_{33}$, FIG. 22B shows magnetization curves of $(Mn_{69}Ga_{31})_{97}Pt_3$, FIG. 22C shows magnetization curves of $(Mn_{71}Ga_{29})_{95}Pt_5$, and FIG. 22D shows magnetization curves of $(Mn_{71}Ga_{29})_{93}Pt_7$. In each of FIGS. 22A to 22D, $g_1$ represents a magnetization curve in a case where a magnetic field is applied parallel to the film plane of $(MnGa)_{100-z}Pt_z$, and $g_2$ represents magnetization curves in a case where a magnetic field is applied in a direction perpendicular to the film plane of $(MnGa)_{100-z}Pt_z$.

Figure 23A:
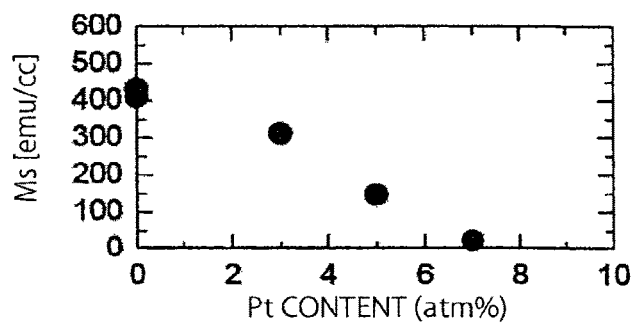
FIGS. 23A and 23B show examples of the magnetic characteristics of a MnGaPt alloy on the Pt content.
Figure 23B:
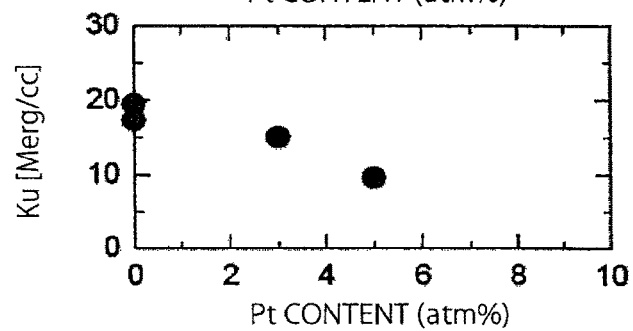
Figures 24A, 24B, 24C, 24D:
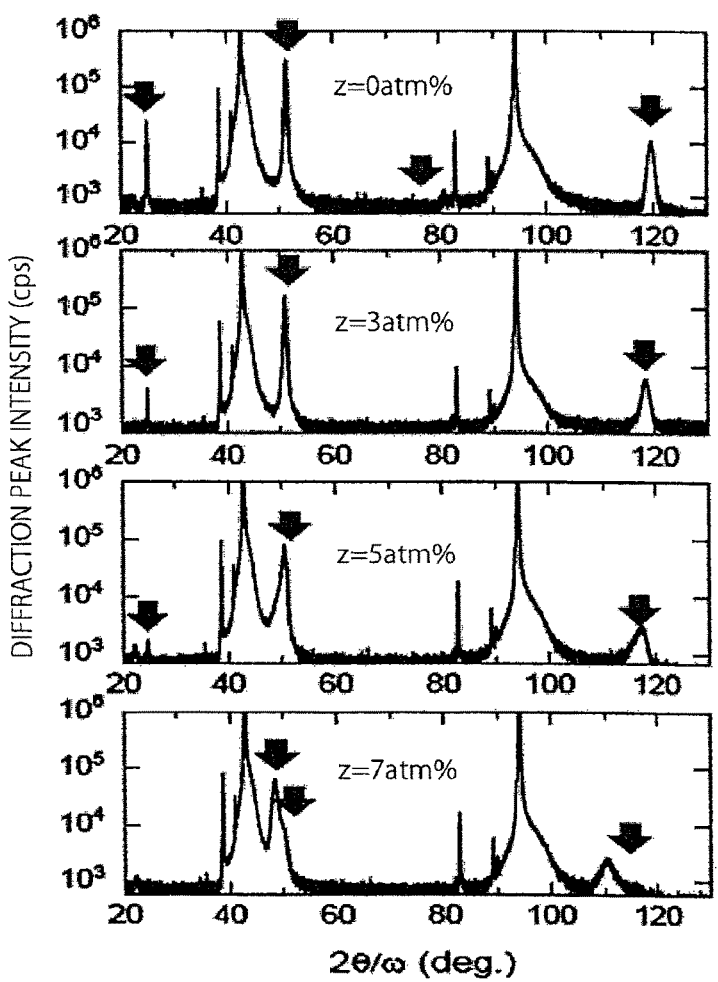
FIGS. 24A to 24D show examples of the dependency of x-ray diffraction of a MnGaPt alloy on the Pt content.

FIGS. 23A and 23B show measurement results of the magnetic characteristics, the saturation magnetization Ms and the magnetic anisotropy energy Ku, of $(MnGa)_{100-z}Pt_z$. The lateral axis in each of FIGS. 23A and 23B shows the Pt content z. FIGS. 24A to 24D show the x-ray diffraction of $(MnGa)_{100-z}Pt_z$ when the Pt content is 0 atm %, 3 atm %, 5 atm %, and 7 atm %, respectively.

As can be understood from FIGS. 23A and 23B, as the Pt content z of $(MnGa)_{100-z}Pt_z$ increases, the saturation magnetization and the perpendicular magnetic anisotropy energy thereof monotonically decrease. In a composition range where the magnetization is obtained, the tetragonal crystal structure is maintained. It is confirmed that when the Pt content is 5 atm %, the saturation magnetization Ms is as low as about 150 (emu/cc), and the perpendicular magnetic anisotropy energy Ku is as high as about $10 \times 10^6$ (erg/cc). This MnGaPt layer meets the characteristics required to serve as a reference layer. Furthermore, it is confirmed from FIGS. 24A to 24C that the upper limit of the Pt content to serve as a perpendicular magnetization film is 10 atm % or less.

A MnGaCr alloy has characteristics to serve as a perpendicular magnetization film in the composition range expressed as $(Mn_xGa_y)_{100-z}Cr_z$ (45 atm %≤x≤75 atm %, 25 atm %≤y≤55 atm %, x+y=100 atm %, 0 atm %<z≤10 atm %), which means $Mn_xGa_y$ (45 atm %≤x≤75 atm %, 25 atm %≤y≤55 atm %, x+y=100 atm %) containing more than 0 atm % but 10 atm % or less of Cr.

It is confirmed from an experiment that when the Cr content is about 9%, for example, MnGaCr has a saturation magnetization Ms as low as 188 (emu/cc), and a perpendicular magnetic anisotropy Ku as high as $4.3 \times 10^6$ (erg/cc), which meet the characteristics required to serve as a reference layer.

A MnGaCo alloy has characteristics to serve as a perpendicular magnetization film in a composition range expressed as $(Mn_xGa_y)_{100-z}Co_z$ (45 atm %≤x≤75 atm %, 25 atm %≤y≤55 atm %, x+y=100 atm %, 0 atm %<z≤10 atm %), which means $Mn_xGa_y$ (45 atm %≤x≤75 atm %, 25%≤y≤55 atm %, x+y=100 atm %) containing more than 0 atm % but 10 atm % or less of Co. Co, which is a magnetic element, is considered to be substituted at the Mn site when included in the base material MnGa. The magnetic moment of Mn is opposite to that of Co at this time, and the entire saturation magnetization tends to decrease as in a ferrimagnetic structure. The ferrimagnetic material has an advantage that the magnetization may be reduced while the magnetic structure remains stable, unlike the case where a nonmagnetic element is added to a ferromagnetic material to simply reduce the magnetization.

Generally, a material with a low saturation magnetization Ms has a low magnetization. Therefore, if an interfacial magnetic layer is used, the magnetic coupling of the material becomes weak. The base material, MnGa, has a lower magnetization than Co-based or Fe-based magnetic materials.

Therefore, the magnetic coupling between MnGa and an interfacial magnetic layer is considered to be weak. However, since MnGaCo includes Co, which is a ferromagnetic material, the magnetic coupling property thereof may be enhanced even if it has a low saturation magnetization Ms. Therefore, it is preferable that an interfacial magnetic layer be used with a MnGaCo magnetic layer. On such an occasion, the interfacial magnetic layer is preferably formed of a magnetic material containing at least one of Co and Fe, which is magnetically compatible with MnGaCo. Specifically, the interfacial magnetic layer may be formed of such materials as CoFeSi, CoFeP, CoFeW, and CoFeNb besides CoFe, CoB, FeB, and CoFeB. Alternatively, the interfacial magnetic layer may be formed of a Co-based Heusler alloy. Specific examples of such a Heusler alloy include $Co_2FeSi$, $Co_2MnSi$, $Co_2MnGe$, and $Co_2MnAl$.

FIGS. 25A to 25F each show magnetization curves of MnGaCo with a specific composition formed on MgO(001). FIGS. 25A to 25F show the magnetization curves of the cases where the Co content is 0 atm %, 7.5 atm %, 10 atm %, 12.5 atm %, 17.5 atm %, and 25 atm %, respectively. In each of FIGS. 25A to 25F, $g_1$ represents a magnetization curve where a magnetic field is applied in parallel to the film plane of MnGaCo, and $g_2$ represents magnetization curves in a case where a magnetic field is applied in a direction perpendicular to the film plane of MnGaCo. It is confirmed from FIG. 25B showing the magnetization curves in the case where the Co content in MnGaCo is 7.5 atm % that the saturation magnetization Ms is as low as 189 (emu/cc), and the perpendicular magnetic anisotropy energy Ku is as high as $9.2 \times 10^6$ (erg/cc). The MnGaCo layer with this Co content meets the characteristics required to serve as a reference layer. As can be understood from FIGS. 25A to 25F, the Co content of MnCaCo acting as a perpendicular magnetization film is more than 0 atm % but 10 atm % or less.

Each of a MnGaNi alloy and a MnGaFe alloy has characteristics to serve as a perpendicular magnetization film in a composition range expressed as $(Mn_xGa_y)_{100-z}Ni_z$ or $(Mn_xGa_y)_{100-z}Fe_z$ (45 atm %≤x≤75 atm %, 25 atm %≤y≤55 atm %, x+y=100 atm %, 0 atm %<z≤10 atm %), which means $Mn_xGa_y$ (45 atm %≤x≤75 atm %, 25 atm %≤y≤55 atm %, x+y=100 atm %) containing more than 0 atm % but 10 atm % or less of Ni or Fe.

Ni or Fe, which is a magnetic element, contained in the base material MnGa forms a NiMn alloy or FeMn alloy with Mn in MnGa. The NiMn alloy and the FeMn alloy are known as antiferromagnetic materials, and have an effect of decreaseing the saturation magnetization of the base material MnGa. Adding a magnetic element that forms an antiferromagnetic material to a ferromagnetic material to reduce its magnetization has an advantage that the magnetic structure remains stable, unlike the case where a nonmagnetic element is added to a ferromagnetic material to simply reduce the magnetization.

Each of a MnGaAu alloy and a MnGaCu alloy has characteristics to serve as a perpendicular magnetization film in a composition range expressed as $(Mn_xGa_y)_{100-z}Au_z$ or $(Mn_xGa_y)_{100-z}Cu_z$ (45 atm %≤x≤75 atm %, 25 atm %≤y≤55 atm %, x+y=100 atm %, 0 atm %<z≤10 atm %), which means $Mn_xGa_y$ (45 atm %≤x≤75 atm %, 25 atm %≤y≤55 atm %, x+y=100 atm %) containing more than 0 atm % but 10 atm % or less of Au or Cu.

Au or Cu, which is a nonmagnetic element, forms a mixed crystal with Mn to form an alloy in a broad region. Therefore, the nonmagnetic element Au or Cu stably forms a mixed crystal MnGaX when included in the base material MnGa. If the content of the added element is less than 10%, the mixed crystal may be formed without considerably changing the crystal structure. Therefore, it is possible to simply reduce the magnetization without degrading the perpendicular magnetic anisotropy.

Each of a MnGaB alloy, a MnGaC alloy, and a MnGaP alloy has characteristics to serve as a perpendicular magnetization film in a composition range expressed as $(Mn_xGa_y)_{100-z}B_z$, $(Mn_xGa_y)_{100-z}C_z$, or $(Mn_xGa_y)_{100-z}P_z$ (45 atm %≤x≤75 atm %, 25 atm %≤y≤55 atm %, x+y=100 atm %, 0 atm %<z<20 atm %), which means $Mn_xGa_y$ (45 atm %≤x≤75 atm %, 25 atm %≤y≤55 atm %, x+y=100 atm %) containing more than 0 atm % but 20 atm % or less of B, C, or P.

The nonmagnetic elements B, C, and P are light elements having a small atomic radius. Therefore, these elements are disposed within the lattice of MnGa serving as the base material. If the content of the nonmagnetic element is more than 0 atm % but less than 20 atm %, the nonmagnetic element is disposed in the lattice without becoming in an amorphous state and with its crystallinity being maintained. Accordingly, it is possible to simply reduce the entire magnetization without degrading the perpendicular magnetic anisotropy. If the content of B, C, or P reaches 20 atm %, the magnetic material may have a perovskite crystal structure, and thus lose the characteristics to serve as a perpendicular magnetization film.

Each of a MnGaGd alloy, a MnGaTb alloy, and a MnGaDy alloy has characteristics to serve as a perpendicular magnetization film in a composition range expressed as $(Mn_xGa_y)_{100-z}Gd_z$, $(Mn_xGa_y)_{100-z}Tb_z$, or $(Mn_xGa_y)_{100-z}Dy_z$ (45 atm %≤x≤75 atm %, 25 atm %≤y≤55 atm %, x+y=100 atm %, 0 atm %<z≤30 atm %), which means $Mn_xGa_y$ (45 atm %≤x≤75 atm %, 25 atm %≤y≤55 atm %, x+y=100 atm %) containing more than 0 atm % but 30 atm % or less of Gd, Tb, or Dy.

Each of Gd, Tb, and Dy, which are magnetic elements, is considered to be substituted at the Mn site when included in the base material MnGa. The magnetic moment of Mn is opposite to that of the magnetic element Gd, Tb, or Dy at this time, and the entire magnetic property tends to change from ferromagnetic to ferrimagnetic or antiferromagnetic depending on the amount of added element. If the content of the above magnetic elements is 0 atm % or more and 30 atm % or less, the material acts as a ferrimagnetic material, which reduces the magnetization while maintaining the magnetic structure, unlike the case where a nonmagnetic element is added to a ferromagnetic material, which simply reduces the magnetization.

The influence of the stray magnetic field from the reference layer is more evident in miniaturized MTJ elements. In order to solve this problem, a bias layer may be employed, the details of which will be described later. Assuming that MTJ elements has a pillar shape, the allowable minimum size (diameter size) of the MTJ elements with a 6-nm-thick reference layer is about 38 nm for the saturation magnetization Ms of 1000 emu/cc, about 28 nm for Ms of 750 emu/cc, and about 20 nm for Ms of 500 emu/cc.

From the foregoing, in order to integrate MTJ elements with the diameter size on the order of 10 nm, reference layers preferably include a material having a low saturation magnetization Ms of 300 emu/cc or less. In order to achieve this, MnGaX may be used to form the reference layers. From the above experimental results, the element X to be added to the reference layer with a low saturation magnetization Ms may preferably be selected from at least one of Al, Ge, Ir, Cr, Co, Pt, Ru, Pd, Rh, Ni, Fe, Re, Au, Cu, B, C, P, Gd, Tb, and Dy.

The thermal stability of the ferromagnetic material of the magnetoresistive elements degrades as the element size reduces. The solutions to this problem include improvement of the perpendicular magnetic anisotropy energy Ku. A large perpendicular magnetic anisotropy energy Ku may be obtained by adding Al, Co, and Pt. Reference layers including these elements are preferable since they have better thermal stability.

It can be understood from the foregoing that a MnGaX alloy forms a perpendicular magnetization film with a low saturation magnetization and a high perpendicular magnetic anisotropy, and is suitable for making a reference layer. In order to have perpendicular magnetic anisotropy, the c-axis should be perpendicular to the film plane so that the crystal grows in (001) orientation. The (001) orientation may be achieved by appropriately selecting the materials of the tunnel barrier layer and the interfacial magnetic layer.

If a magnetoresistive element includes the interfacial magnetic layer 6 as in the second to fourth embodiments, and the interfacial magnetic layer 6 is a MnGaX magnetic layer containing Mn, Ga, and at least one element from the group of Al, Ge, Ir, Cr, Co, Pt, Ru, Pd, Rh, Ni, Fe, Re, Au, Cu, B, C, P, Gd, Tb, and Dy, the ferromagnetic layer 8 may be formed of the following materials. The ferromagnetic layer 8 may be formed of a metal whose crystal orientation is face-centered cubic (FCC) (111) or hexagonal close-packed (HCP) (0001) or a metal which may form an artificial superlattice, or an alloy of Mn and at least one of Al, Ge, and Ga. An example of a metal with a crystal orientation of FCC(111) or HCP(0001) is an alloy containing at least one of Fe, Co, Ni, and Cu and at least one of Pt, Pd, Rh, and Au. Specific examples of such materials include ferromagnetic alloys such as CoPd, CoPt, NiCo, and NiPt. Specific examples of an alloy containing Mn and at least one of Al, Ge, and Ga include ferromagnetic alloys such as MnGa, MnGe and MnAlGe.

The artificial superlattice of the ferromagnetic layer 8 may have a structure in which an alloy (ferromagnetic layers) containing at least one of Fe, Co, and Ni and an alloy (nonmagnetic films) containing at least one of Cr, Pt, Pd, Ir, Rh, Ru, Os, Re, Au, and Cu are alternately stacked. For example, a Co/Pt artificial superlattice, a Co/Pd artificial superlattice, a CoCr/Pt artificial superlattice, a Co/Ru artificial superlattice, a Co/Os artificial superlattice, a Co/Au artificial superlattice, or a Ni/Cu artificial superlattice may be formed. The magnetic anisotropy energy density and the saturation magnetization of these artificial superlattices may be controlled by adjusting the amount of the element added to the ferromagnetic layer, and the ratio in thickness between the ferromagnetic layer and the nonmagnetic layer.

The ferromagnetic layer 8 may also be formed of an alloy containing at least one transition metals Fe, Co, and Ni, and at least one rare earth metals Tb, Dy, and Gd. Examples of such an alloy include TbFe, TbCo, TbFeCo, DyTbFeCo, and GdTbCo. The ferromagnetic layer 8 may have a multilayer structure obtained by alternately stacking layers of these alloys. The specific examples of the multilayer structure include layers such as TbFe/Co, TbCo/Fe, TbFeCo/CoFe, DyFe/Co, DyCo/Fe, and DyFeCo/CoFe. The magnetic anisotropy energy density and the saturation magnetization of these alloys may be adjusted by controlling the thickness ratio and the compositions of the alloys.

The ferromagnetic layer 8 may also be formed of an alloy containing at least one of Fe, Co, Ni, and Cu, and at least one of Pt, Pd, Rh, and Au. Specific examples of this alloy are ferromagnetic alloys such as FeRh, FePt, FePd, and CoPt.

(Base Layer 100)

The base layer 100 is used to control the crystallinity such as the crystal orientation and the crystal grain size of the ferromagnetic layer 2 and the layers above the ferromagnetic layer 2. Therefore, the choice of the material of the base layer 100 is important. The material and the structure of the base layer 100 will be described below. The base layer may be conductive or nonconductive. If a current should pass through the base layer, a conductive material is preferably used to form the base layer.

A first example of the base layer 100 is a nitride layer having a (001) oriented NaCl structure and containing at least one of Ti, Zr, Nb, V, Hf, Ta, Mo, W, B, Al, and Ce.

A second example of the base layer 100 is a (002) oriented conductive perovskite oxide layer of $ABO_3$. The site A includes at least one of Sr, Ce, Dy, La, K, Ca, Na, Pb, and Ba, and the site B includes at least one of Ti, V, Cr, Mn, Fe, Co, Ni, Ga, Nb, Mo, Ru, Ir, Ta, Ce, and Pb.

A third example of the base layer 100 is an oxide layer having a (001) oriented NaCl structure, and containing at least one of Mg, Al, and Ce.

A fourth example of the base layer 100 is a layer having a (001) oriented tetragonal structure or cubic structure, and containing at least one of Al, Cr, Fe, Co, Rh, Pd, Ag, Ir, Pt, Au, Mo, and W.

A fifth example of the base layer 100 has a multilayer structure including two or more layers of the first to fourth examples.

Thus, the crystallinity of the ferromagnetic layer 2 and the layers above the ferromagnetic layer 2 may be controlled, and the magnetic characteristics thereof may be improved by carefully selecting the base layer.

(Nonmagnetic Layer 4)

The nonmagnetic layer 4 may be either conductive or nonconductive, but is preferably formed as a tunnel barrier layer of an insulating material. Selective tunneling conductivity and a high magnetoresistive ratio may be achieved for the nonmagnetic layer 4 by employing a suitable combination of adjacent ferromagnetic layer and interfacial magnetic layer. Therefore, the choice of the material of the nonmagnetic layer 4 is important. The material of the nonmagnetic layer 4 will be described below.

The tunnel barrier layer may be formed of an oxide containing at least one of Mg, Ca, Ba, Al, Be, Sr, Zn, Ti, V, and Nb. Specific examples of the oxide are MgO, AlO, ZnO, SrO, BaO, and TiO. In particular, an oxide having a NaCl crystal structure is preferable. Specific examples of such an oxide include MgO, CaO, SrO, BaO, TiO, VO, and NbO. These oxides having the NaCl structure easily grow with the preferred orientation of (001) plane on an alloy containing at least one of Fe, Co, and Ni as the main constituent, or a metal having the body-centered cubic structure with the (001) preferred orientation, or an alloy containing two or more of the above materials as the main constituents, or the (001) plane of an MnGaX alloy. In particular, the oxides may grow very easily with the preferred orientation of (001) plane on a CoFe—X amorphous alloy which contains a slight amount of B, C, N, Ti, Ta, P, Mo, Si, W, or Nb to improve the amorphous property. In CoFe—X, X means an added element such as B, C, and N.

The tunnel barrier layer may also be formed of a mixed crystal of two or more materials selected from the aforementioned oxides, or have a multilayer structure including layers of such mixed crystals. Examples of mixed crystal include MgAlO, MgZnO, MgTiO, and MgCaO. Examples of a two-layer structure include MgO/ZnO, MgO/AlO, TiO/AlO, and MgAlO/MgO. Examples of three-layer structure include AlO/MgO/AlO, ZnO/MgO/ZnO, and MgAlO/MgO/MgAlO.

A second example of the tunnel barrier layer is a layer of (002) oriented perovskite oxide of $ABO_3$, where the site A includes at least one of Sr, Ce, Dy, La, K, Ca, Na, Pb, and Ba, and the site B includes at least one of Ti, V, Cr, Mn, Fe, Co, Ni, Ga, Nb, Mo, Ru, Ir, Ta, Ce, and Pb. Specific examples of $ABO_3$ include $SrTiO_3$, $SrRuO_3$, $SrNbO_3$, $BaTiO_3$, and $PbTiO_3$. The lattice constant on the {100} plane of these oxides is about 3.7 Å-4.0 Å. Although the lattice constant may vary in accordance with the composition range, this lattice constant range would match the lattice constant of about 3.9 Å of the {100} plane of the MnGa alloy that is the base material of MnGaX. Therefore, the above oxides form a good interface with the base material, and are suitable for obtaining a great magnetoresistive ratio.

A third example of the material of the tunnel barrier layer is a spinel oxide, MgAlO. The lattice constant of $MgAl_2O_4$ having the spinel structure is about 4.05 Å. Although the lattice constant may vary in accordance with the composition range, this lattice constant range causes relatively small lattice mismatch with a MnGa alloy having a lattice constant of about 3.9 Å on the {100} plane, which serves as the base material of MnGaX. Therefore, the above oxide forms a good interface with the base material, and is suitable for obtaining a great magnetoresistive ratio.

The material of the tunnel barrier layer may be either crystalline or amorphous. If the tunnel barrier layer is crystallized, the scattering of electrons in the tunnel barrier is suppressed, and the possibility may be increased that selective tunneling conduction of electrons from the ferromagnetic layer may be performed with their wave numbers being maintained. This improves the magnetoresistive ratio. Therefore, the crystalline tunnel barrier is more preferable for obtaining a great magnetoresistive ratio.

If an MTJ element has a multilayer structure including a ferromagnetic layer of CoFe(B), a nonmagnetic layer of crystalline MgO, and a ferromagnetic layer of MnGaX stacked in this order, the orientation relationship MnGaX (001)/MgO(001)/CoFe(B)(001) may be obtained. CoFe(B) here means that the ferromagnetic layer may contain B other than Co and Fe. This improves the wave number selection range of the tunneling electrons. Therefore, a great magnetoresistive ratio may be obtained. However, the lattice mismatch calculated from the bulk lattice constants of the base material MnGa and MgO in the in-plane direction is rather high, about 8%. The lattice mismatch is defined by the following formula.

$$(a(MgO)-a(MnGa))/a(MnGa) \times 100$$

where a(MgO) and a(MnGa) are lattice constants of MgO and MnGa in the in-plane direction. A high lattice mismatch causes dislocations at the interface in order to reduce the interfacial energy caused by the lattice strain. In this case, the epitaxial relationship holds between the crystal grains. Therefore, a constant epitaxial growth of crystal over the entire film plane is difficult. If an electrical current is caused to pass through the MTJ element, the transfer causes electron scattering, which reduces the magnetoresistive ratio. In order to obtain a constant epitaxial growth in the film plane without causing the transfer, it is important to select materials for small lattice mismatch. Therefore, from the viewpoint of lattice mismatch, the materials suitable for forming the nonmagnetic layer are perovskite oxides, spinel oxides, and NaCl oxides, which are listed in the favorable order.

(Interfacial Magnetic Layer 3 and Interfacial Magnetic Layer 6)

The interfacial magnetic layer 3 and the interfacial magnetic layer 6 are perpendicular magnetization films. The materials suitable for forming these layers have a low saturation magnetization Ms, a high magnetic anisotropy Ku for maintaining the thermal stability factor Δ, and a high polarizability in order to have a high thermal stability and to perform magnetization switching with a low current. Examples of these materials are MnGaX alloy magnetic materials containing Mn and Ga. The foregoing characteristics will be specifically described below.

As described above, a specific example of the material of the interfacial magnetic layer 3 and the interfacial magnetic layer 6 is a MnGaX alloy containing Mn, Ga, and at least one of Al, Ge, Ir, Cr, Co, Pt, Ru, Pd, Rh, Ni, Fe, Re, Au, Cu, B, C, P, Gd, Tb, and Dy. The specific examples of the MnGaX alloy include MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

MnGaX has characteristics to serve as a perpendicular magnetization film in an appropriate composition range. In order to have the perpendicular magnetic anisotropy, the c-axis is needed to be (001) oriented along a direction perpendicular to the film plane. Specifically, the crystal orientation of the ferromagnetic layer 2 and the interfacial magnetic layer 3 may be controlled by appropriately selecting the material of the base layer 100, and the crystal orientation of the interfacial magnetic layer 6 and the ferromagnetic layer 8 may be controlled by appropriately selecting the material of the nonmagnetic layer 4.

Generally, the Gilbert damping constant (damping factor) correlates to the degree of the spin orbit interaction in the material. A material having a larger atom number has a larger spin orbit interaction, and therefore a larger Gilbert damping constant. The base material of MnGaX, MnGa, includes light elements, and therefore has a small Gilbert damping constant. Accordingly, the energy required for the magnetization switching of this material is low, which considerably reduces the current density for switching the magnetization by spin-polarized electrons. Therefore, MnGaX can be effectively applied to the interfacial magnetic layer 3. If Al is selected as the added element X, the MnGaX exists as an alloy of tetragonal MnGa and tetragonal MnAl. Therefore, the Gilbert damping constant of the MnGaAl alloy can be made low by controlling the composition. Thus, the MnGaAl alloy is more suitable to form the interfacial magnetic layer 3. MnGaAl may have ideal Δ1 band half metal characteristics as described with reference to FIGS. 16A and 16B. Therefore, it is expected to have a high polarizability. Similar effects may be obtained from Cr when added to MnGa. It can be understood from the foregoing that MnGaAl and MnGaCr are suitable materials to form interfacial magnetic layers for the storage layers and the reference layers.

A second example of the material of the interfacial magnetic layer 3 and the interfacial magnetic layer 6 is an alloy containing one of Mn, Fe, Co, and Ni, and two of Zn, Al, Ga, In, Si, Ge, Sn, As, Sb, and Bi, such as MnAlGe and MnZnSb.

A third example of the material of the interfacial magnetic layer 3 and the interfacial magnetic layer 6 is a metal alloy containing at least one of Fe and Co. It is especially preferable that the interfacial magnetic layer 6 is formed of such a metal alloy. For example, the orientation relationship CoFe(001)/MgO(001)/CoFe(001) can be made by an interfacial magnetic layer of CoFe, a nonmagnetic layer of MgO, and an interfacial magnetic layer of CoFe. This improves the wave number selection range of tunneling electrons to obtain a large magnetoresistive ratio. In order to control the saturation magnetization of the interfacial magnetic layer 3 and the interfacial magnetic layer 6, at least one of Ni, B, C, P, Ta, Ti, Mo, Si, W, Nb, Mn, and Ge may be added to the interfacial magnetic layer 3 and the interfacial magnetic layer 6. Thus, the interfacial magnetic layer 3 and the interfacial magnetic layer 6 may be formed of an alloy containing at least one of Fe and Co, and at least one of Ni, B, C, P, Ta, Ti, Mo, Si, W, Nb, Mn, and Ge. Specific examples of such an alloy include CoFeSi, CoFeP, CoFeW, and CoFeNb besides CoFeB. These alloys have the spin polarization equivalent to that of CoFeB. Furthermore, a Heusler metal such as $Co_2FeSi$, $Co_2MnSi$, and $Co_2MnGe$ may also be employed. Heusler metals have spin polarization equivalent to or higher than that of CoFeB, and are thus suitable for forming the interfacial magnetic layer.

A fourth example of the interfacial magnetic layer 3 and the interfacial magnetic layer 6 is a MnAl alloy. MnAl alloys are formed of light elements, and thus have a small Gilbert damping constant. Accordingly, the energy required for the magnetization switching is low, which considerably reduces the current density for switching the magnetization of spin-polarized electrons. The MnAl alloy has an energy gap in either up-spin or down-spin energy band in the [001] direction. Therefore, it has half metallic characteristics such as a high spin polarization to have a large magnetoresistive ratio.

If the interfacial magnetic layer 3 and the interfacial magnetic layer 6 are epitaxially grown with respect to the nonmagnetic layer 4, a large magnetoresistive ratio can be obtained. Therefore, the lengths of the interfacial magnetic layer 3 and the interfacial magnetic layer 6 that are in contact with the nonmagnetic layer 4 may be increased or decreased in a direction perpendicular to the film plane.

Fifth Embodiment

A magnetic memory (MRAM) employing a spin transfer torque write method will be described as a fifth embodiment below.

Figure 26:
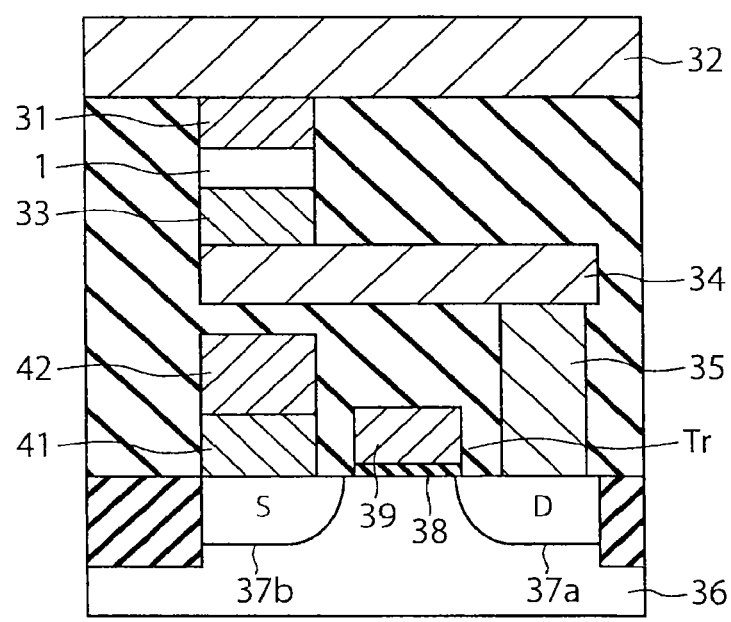
FIG. 26 is a cross-sectional view showing a memory cell of a magnetic memory according to a fifth embodiment.

The MRAM according to the fifth embodiment includes a plurality of memory cells. FIG. 26 is a sectional view of a main part of one of the memory cells in the MRAM according to the fifth embodiment. Each memory cell includes, as a storage element, a magnetoresistive element according to any of the first to fourth embodiments and their modifications. In the descriptions of the fifth embodiment, the storage element is the magnetoresistive element (MTJ element) 1 according to the first embodiment.

As shown in FIG. 26, the top surface of the MTJ element 1 is connected to a bit line 32 via an upper electrode 31. The lower surface of the MTJ element 1 is connected to a drain region 37a of the source and drain regions of a semiconductor substrate 36 via a lower electrode 33, an extraction electrode 34, and a plug 35. The drain region 37a, a source region 37b, a gate insulating film 38 on the substrate 36, and a gate electrode 39 on the gate insulating film 38 constitute a selection transistor Tr. The selection transistor Tr and the MTJ element 1 constitute one memory cell of the MRAM. The source region 37b is connected to another bit line 42 via a plug 41. The lower electrode 33 and the plug 35 may be connected without using the extraction electrode 34 by disposing the plug 35 immediately below the lower electrode 33. The bit lines 32 and 42, the electrodes 31 and 33, the extraction electrode 34, and the plugs 35 and 41 are formed of such elements as W, Al, AlCu, and Cu.

Figure 27:
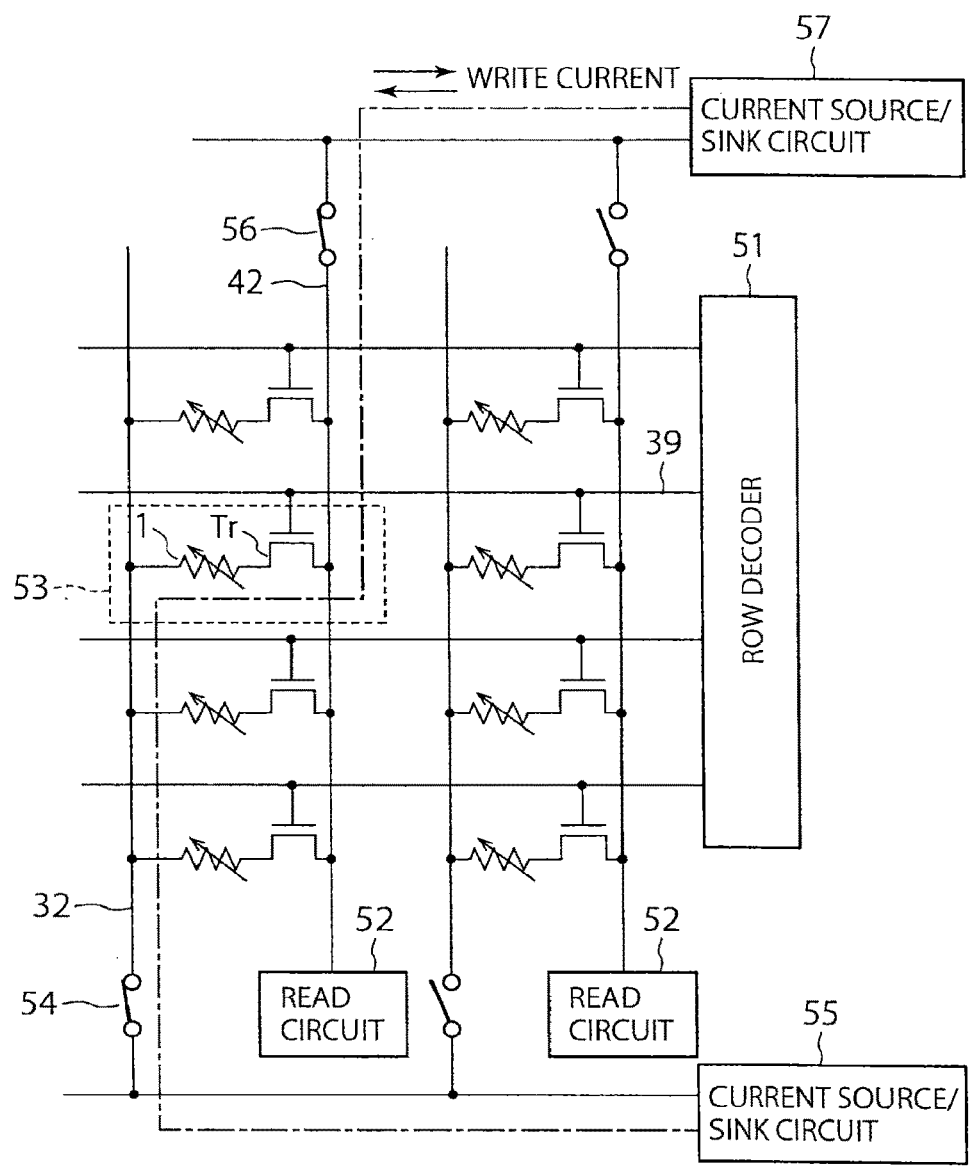
FIG. 27 is a circuit diagram of a main part of the magnetic memory according to the fifth embodiment.

A memory cell array of the MRAM according to the fifth embodiment is formed by arranging, in rows and columns, a plurality of memory cells shown in FIG. 26. FIG. 27 is a circuit diagram showing the main part of the MRAM according to the fifth embodiment.

As shown in FIG. 27, a plurality of memory cells 53 each including a MTJ element 1 and a selection transistor Tr are arranged in rows and columns. A first terminal of each of the memory cells 53 in the same row is connected to the same one of the bit lines 32, and a second terminal is connected to the same one of the bit lines 42. The gate electrodes (word lines) 39 of the selection transistors Tr of the memory cells 53 in the same row are contacted to one another, and to a row decoder 51.

Each of the bit lines 32 is connected to a current source/sink circuit 55 via a switching circuit 54 such as a transistor. Each of the bit lines 42 is connected to a current source/sink circuit 57 via a switching circuit 56 such as a transistor. The current source/sink circuits 55 and 57 supply a write current to the connected bit lines 32 and 42, or extract a current from the connected bit lines 32 and 42.

Each of the bit lines 42 is also connected to a readout circuit 52. The readout circuit 52 may be connected to each of the bit lines 32. The readout circuit 52 includes such elements as a read current circuit and a sense amplifier.

A write operation is performed by turning on the switching circuits 54 and 56 connected to a memory cell to be written and also turning on the selection transistor Tr of the memory cell to be written to form a current path passing through the memory cell to be written. Depending on the data to be written, one of the current source/sink circuits 55 and 57 serves as a current source circuit, and the other serves as a current sink circuit. As a result, a write current flows in a direction depending on the data to be written.

The spin transfer writing may be performed with a current having a pules width of a few nenoseconds to a few microseconds.

A read operation is performed by supplying a read current to a MTJ element 1 designated by a read current circuit in the same manner as in the write operation, the read current being satisfactorily low so that the magnetization switching is not caused. The readout circuit 52 determines the resistance state of the MTJ element 1 by comparing a current value or a voltage value of the MTJ element 1 with a reference value, the current or voltage value resulting from the resistance value of the MTJ element 1, which is dependent on its magnetization state.

It is preferable that the current pulse width in the read operation is shorter than that in the write operation. This may prevent erroneous writing caused by the read current. This is based on the principle that a shorter pulse width results in a greater absolute value in a write current.

As described above, according to the fifth embodiment, a magnetic memory including magnetoresistive elements each having a low saturation magnetization and a high perpendicular magnetic anisotropy may be obtained.

A magnetoresistive element according to an embodiment can comprise: a first magnetic layer; a second magnetic layer; and a first nonmagnetic layer disposed between the first magnetic layer and the second magnetic layer, the first magnetic layer including $(Mn_xGa_y)_{100-z}Ge_z$ (45 atm %≤x≤55 atm %, 45 atm %≤y≤55 atm %, x+y=100 atm %, 20 atm %≤z≤60 atm %).

A magnetoresistive element according to another embodiment can comprise: a first magnetic layer; a second magnetic layer; and a first nonmagnetic layer disposed between the first magnetic layer and the second magnetic layer, the first magnetic layer including $(Mn_xGa_y)_{100-z}X_z$ (45 atm %≤x≤75 atm %, 25 atm %≤y≤55 atm %, x+y=100 atm %, 0 atm %<z<20 atm %), where X is at least one of B, C, and P.

A magnetoresistive element according to a further embodiment can comprise: a first magnetic layer; a second magnetic layer; and a first nonmagnetic layer disposed between the first magnetic layer and the second magnetic layer, the first magnetic layer including $(Mn_xGa_y)_{100-z}X_z$ (45 atm %≤x≤75 atm %, 25 atm %≤y≤55 atm %, x+y=100 atm %, 0 atm %<z≤30 atm %), where X is at least one of Gd, Tb, and Dy.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
a first ferromagnetic layer;
a second ferromagnetic layer; and
a first nonmagnetic layer disposed between the first ferromagnetic layer and the second ferromagnetic layer, the first ferromagnetic layer comprising $(Mn_xGa_y)_{100-z}Pt_z$, the $(Mn_xGa_y)_{100-z}Pt_z$ having a tetragonal crystal structure,
wherein
45 atm %≤x≤75 atm %,
25 atm %≤y≤55 atm %,
x+y=100 atm %, and
0 atm %<z≤7 atm %.

2. The magnetoresistive element according to claim 1, further comprising a third ferromagnetic layer disposed between the first ferromagnetic layer and the first nonmagnetic layer, or between the second ferromagnetic layer and the first nonmagnetic layer.

3. The magnetoresistive element according to claim 2, wherein the third ferromagnetic layer comprises at least one selected from the group consisting of Co, Fe, and Ni.

4. A magnetic memory comprising:
the magnetoresistive element according to claim 1;
a first wiring line electrically connected to the first ferromagnetic layer of the magnetoresistive element; and
a second wiring line electrically connected to the second ferromagnetic layer of the magnetoresistive element.

* * * * *